United States Patent
Takahashi et al.

(10) Patent No.: US 6,944,081 B2
(45) Date of Patent: Sep. 13, 2005

(54) SEMICONDUCTOR STORAGE AND ITS REFRESHING METHOD

(75) Inventors: Hiroyuki Takahashi, Kanagawa (JP); Atsushi Nakagawa, Kanagawa (JP); Yoshiyuki Katou, Kanagawa (JP); Hideo Inaba, Kanagawa (JP); Noriaki Komatsu, Kanagawa (JP); Takuya Hirota, Kanagawa (JP); Masahiro Yoshida, Kanagawa (JP)

(73) Assignee: NEC Electronics Corporation (JP)

( * ) Notice: Subject to any disclaimer, the term of this patent is extended or adjusted under 35 U.S.C. 154(b) by 121 days.

(21) Appl. No.: 10/363,298
(22) PCT Filed: Aug. 30, 2001
(86) PCT No.: PCT/JP01/07487

§ 371 (c)(1),
(2), (4) Date: Aug. 13, 2003

(87) PCT Pub. No.: WO02/19340
PCT Pub. Date: Mar. 7, 2002

(65) Prior Publication Data
US 2004/0041173 A1 Mar. 4, 2004

(30) Foreign Application Priority Data
Aug. 31, 2000 (JP) ........................................ 2000-264547

(51) Int. Cl.[7] .................................................. G11C 7/00
(52) U.S. Cl. ............. 365/222; 365/230.03; 365/230.06
(58) Field of Search ........................... 365/222, 230.03, 365/230.06, 230.05

(56) References Cited

U.S. PATENT DOCUMENTS

| 4,777,624 A | * 10/1988 | Ishizawa et al. ............ 365/222 |
|---|---|---|
| 4,984,208 A | 1/1991 | Sawada et al. |
| 5,461,587 A | 10/1995 | Oh |
| 5,742,554 A | 4/1998 | Fujioka |
| 5,796,664 A | 8/1998 | Tsuruda et al. |
| 6,111,808 A | * 8/2000 | Khang et al. ........... 365/230.03 |
| 6,551,846 B1 | * 4/2003 | Furutani et al. .............. 438/17 |

FOREIGN PATENT DOCUMENTS

| JP | 62-188095 | 8/1987 |
|---|---|---|
| JP | 2-187987 | 7/1990 |
| JP | 4-89694 | 3/1992 |
| JP | 5-101669 | 4/1993 |
| JP | 7-105679 | 4/1995 |
| JP | 7-192491 | 7/1995 |
| JP | 8-77769 | 3/1996 |
| JP | 9-180442 | 7/1997 |
| JP | 10-83694 | 3/1998 |

* cited by examiner

*Primary Examiner*—Huan Hoang
(74) *Attorney, Agent, or Firm*—Choate, Hall, Stewart LLP

(57) ABSTRACT

A semiconductor memory device capable of a further reduction in power consumption for refresh operation is provided. Cell arrays S0, S1 are divided into respective four blocks B0~B3 and B10~B13. In a normal read/write operation, by address data designating a word line, one of the cell arrays is selected, and also one block is selected in the selected cell array, and further one word line is selected in the selected block. In a refresh operation, one of the cell arrays is selected, and four blocks in the selected cell array are simultaneously refreshed. Namely, respective one word line is selected from each of the four blocks, and the selected word lines are refreshed, thereby to reduce a power comsumption as compared to when the plural cell arrays are refreshed.

26 Claims, 13 Drawing Sheets

3rd word decoder   SD 2-4 decoder 12-64 decoder

2nd word decoder

3rd word decoder

3rd word decoder

2nd word decoder

US 6,944,081 B2

SEMICONDUCTOR STORAGE AND ITS REFRESHING METHOD

TECHNICAL FIELD OF THE INVENTION

The present invention relates to a semiconductor memory device and its refresh method, and more particularly to a semiconductor memory device reduced in power comsumption for refresh operations and its refresh method.

PRIOR ART

A conventional structural example of the semiconductor memory device showing refresh operation is disclosed in Japanese laid-open patent publication No. 8-77769. FIG. 1 is a block diagram illustrative of the conventional structural example of the semiconductor memory device. The semiconductor memory device has the following structure in addition to memory cell arrays 2a and 2b. A read/write address Add for the memory cell arrays 2a and 2b is entered into an address buffer 1. A first X-buffer 3a is connected to the address buffer 1 for receiving an input of address data AD outputted from the address buffer 1, and reading the same based on an external input signal /RASAN (hereinafter "/" representing negative logic signal).

An input side of a first multiplexer 4a is connected to the first X-buffer 3a and an address generating circuit 10, and an output side of the first multiplexer 4a is connected to a first X-decoder 5a. The first multiplexer 4a is controlled based on the refresh control signal /AR. In the normal operation mode or the non-refresh mode, the refresh control signal /AR is "1", whereby the first multiplexer 4a supplies the first X-decoder 5a with the output from the first X-buffer 3a. In the refresh mode, the refresh control signal /AR is "0", whereby the first multiplexer 4a supplies the first X-decoder 5a with the output from the address generating circuit 10.

The first X-decoder 5a decodes the output from the first multiplexer 4a, and drives a word line of the first memory array 2a based on the decoded result. A first sense amplifier 6a amplifies a signal on a bit line of the memory array 2a and supplies the amplified signal onto an I/O buffer (illustration is omitted).

A first gate circuit 7a is connected to a refresh bank activation circuit 12 and generates a first activation signal /RASA which activates the first X-decoder 5a and the first sense amplifier circuit 6 based on the signal /RASR from the refresh bank activation circuit 12 and also on an externally entered input signal /RASAN, for activating the first X-decoder 5a and the first sense amplifier 6a.

The first bank BAK comprises the above-described structural elements 2a, 3a, 4a, 5a, 6a and 7a. Descriptions for the column decoder for selecting the bit line and its control system will be omitted.

A second X-buffer 3b is connected to the address buffer 1 for receiving an input of address data BD outputted from the address buffer 1, and reading the same based on an external input signal /RASBN.

An input side of a second multiplexer 4a is connected to the second X-buffer 3b and the address generating circuit 10, and an output side of the second multiplexer 4b is connected to a second X-decoder 5b. The second multiplexer 4b is controlled based on the refresh control signal /AR. In the normal operation mode or the non-refresh mode, the refresh control signal /AR is "1", whereby the second multiplexer 4b supplies the second X-decoder 5b with the output from the second X-buffer 3b. In the refresh mode, the refresh control signal /AR is "0", whereby the second multiplexer 4b supplies the second X-decoder 5b with the output from the address generating circuit 10.

The second X-decoder 5b decodes the output from the second multiplexer 4b, and drives a word line of the second memory array 2b based on the decoded result. A second sense amplifier 6b amplifies a signal on a bit line of the memory array 2b and supplies the amplified signal onto an I/O buffer (illustration is omitted).

A second gate circuit 7b is connected to the refresh bank activation circuit 12 and generates a second activation signal /RASB which activates the second X-decoder 5b and the second sense amplifier circuit 6b based on the signal /RASR from the refresh bank activation circuit 12 and also on an externally entered input signal /RASBN, for activating the second X-decoder 5b and the second sense amplifier 6b.

The second bank BAK comprises the above-described structural elements 2b, 3b, 4b, 5b, 6b and 7b. Descriptions for the column decoder for selecting the bit line and its control system will be omitted.

A refresh mode detecting circuit 11 detects that the refresh mode was designated, based on a chip select signal /CS, a signal /RAS, a signal /CAS, and a write enable signal /WE, and outputs a refresh signal /AR (pule signal). The refresh bank activation circuit 12 is connected to a refresh mode detecting circuit 11 for receiving the refresh signal /AR, and supplies the gate circuits 7a and 7b with the signal /RASR which activate both the banks BKA and BKB. A refresh counter 13 is connected to the refresh mode detecting circuit 11 for receiving the refresh signal /AR, and sequentially counting up the refresh signal /AR, and supplies the counted value to the address generating circuit 10. The address generating circuit 10 comprises a latch circuit for reading the output from the refresh counter 13 based on the refresh signal /AR, and then supplies the multiplexers 4a and 4b with the same.

In accordance with this structure, in the normal read/write operation (signal /AR="1"), the address Add as the address data AD is supplied through the address buffer 1 to the X-buffers 3a and 4a. For example, if the signal /RASAN ("0") is outputted which selects the memory array 2a of the bank BKA, then the address data AD are read by the X-buffer 3a. At this time, the refresh signal /AR is "1", and thus the address data AD in the X-buffer 3a are supplied through the multiplexer 4a to the X-decoder 5a. At this time, the gate circuit 7a supplies the above signal /RASAN to the X-decoder 5a and the sense amplifier circuit 6a for activating those circuits, whereby the X-decoder 5a selects the word line corresponding to the address data AD in the memory array 2a.

For refreshing the memory arrays 2a and 3a, the refresh signal /AR ("0") is outputted from the refresh mode detecting circuit 11. The refresh bank activating circuit 12 receives this refresh signal /AR and supplies the signal /RASR to the gate circuits 7a and 7b. The gate circuits 7a and 7b receive this signal /RASR and outputs the signal /RASA and the signal /RASB for activating the X-decoder 5a, the sense amplifier circuit 6a, the X-decoder 5b, and the sense amplifier circuit 6b, respectively.

The output of the refresh signal /AR causes the refresh counter 13 to be counted up, and the count output is then read by the address generating circuit 10. The read data are then supplied through the multiplexers 4a and 4b to the X-decoders 5a and 5b, respectively. Word lines corresponding to the output from the refresh counter 13 and being in the memory arrays 2a and 2b are refreshed. Subsequently, the refresh signal /AR ("0") is again outputted, whereby the refresh counter 13 is counted up, so that the word lines in the memory arrays 2a and 2b are refreshed based on the count output. The above operations will be repeated.

What has been described above is the schematic structure and operation of the semiconductor memory device shown in FIG. 1. As can been seen from the above, the semiconductor memory device has the bank-configuration, wherein respective banks BKA and BKB are operable independently from each other. For the refresh operations, both peripheral circuits for the memory arrays 2a and 2b are activated, and respective one word lines of the memory arrays 2a and 2b are concurrently selected and memory cells connected to those word lines are concurrently refreshed.

In contrast to the above-described semiconductor memory device with the bank structure, there has been known a semiconductor memory device with a cell array structure. This semiconductor memory device with the cell array structure has a plurality of memory arrays, which are not independent in read/write operations. In other word, this cell array structure substantially corresponds to one bank of the bank structure.

Notwithstanding, in case of this cell array structure, the concurrent read/write operation is allowed for only one memory array, while the concurrent refresh operation is allowed for a plurality of the memory arrays. In the conventional semiconductor memory device with the cell array structure, a plurality of the memory arrays are concurrently refreshed in order to shorten the refresh time.

As described above, both the conventional semiconductor memory device with the bank-structure and the other conventional semiconductor memory device with the block-structure perform the concurrent refresh operations for shortening the refresh time.

Issue to be Solved by the Invention

In recent years, the semiconductor memory devices have widely been used in a variety of portable devices such as portable telephones. For the semiconductor memory device used in the portable device, it is a great issue how to reduce the power consumption. Particularly, for the semiconductor memory devices which need refresh operations such as the DRAM or the pseudo SRAM, the important issue is how to reduce the power consumption for the refresh operation. Notwithstanding, the above-described conventional semiconductor memory devices with either the bank-structure or the block-structure have a disadvantage of a large power consumption for refresh operation. The concurrent refresh of the plural memory arrays shortens the refresh time but need to activate the respective peripheral circuits for the respective memory arrays, whereby this activation increases the power consumption. The pseudo SRAM is the semiconductor memory device which has the same memory cells as the DRAM (dynamic RAM) and the same usage as the SRAM (static RAM).

The present invention was made in consideration of the above-circumstances, and an object of the present invention is to provide a semiconductor memory device with a further reduced power consumption for refresh operation and its refresh method.

Means for Solving the Issue

The present invention was made to solve the above issues and provides a semiconductor memory device having a plurality of memory cells which need refresh operations, the semiconductor memory device having: a plurality of first selecting circuits provided for a plurality of cell arrays; a second selecting circuit for supplying a common selecting signal to the plurality of first selecting circuits based on an internal address signal, wherein in a refresh operation, the second selecting circuit does not select at least one cell array of the plurality of cell arrays and does select the remaining of the plurality of cell arrays, and only a first selecting circuit of the selected at least one cell array is selectively activated in the plurality of first selecting circuits.

It is possible that a first selecting circuit of the selected cell array batch-selects a plurality of word lines.

It is also possible that the second selecting circuit selects one cell array in the plurality of cell arrays, and only a first selecting circuit of the selected cell array is activated.

It is also possible to further comprise: an address input means being electrically coupled to the second selecting circuit for outputting an internal address signal based on an externally-entered address signal and supplying the internal address signal to the second selecting circuit.

It is also possible that the first selecting circuit has a first word line selecting circuit outputting first word line selecting signals, and a second word line selecting circuit outputting second word line selecting signals, the first word line selecting signal comprises selecting signals to be entered into a plurality of word drivers, the second word line selecting signal comprises a selecting signal to be entered into a plurality of word drivers, into which respective selecting signals of the first word line selecting signal entered, and the second word line selecting signal is common to a plurality of the first word line selecting signal.

It is also possible to further comprise: a boost circuit for selectively supplying a boosted potential to only a first selecting circuit of the selected cell array in the plurality of first selecting circuits.

It is also possible that in a data read operation and a data write operation to the memory cells, each of the first and second word line selecting circuits outputs respective one signal.

It is also possible that each of the plurality of cell arrays is divided into a plurality of blocks, and each of the plurality of blocks has a data read means connected to drain terminals of the memory cells.

It is also possible that the plurality of word line selecting signals batch-selected in a refresh operation are to select the same number of word lines for every the blocks.

It is also possible that the address input means comprises a gate circuit for making an ON/OFF control of the external address signal based on a chip selecting signal.

It is also possible that when a refresh signal is supplied externally, the first word line selecting circuit outputs a first word line selecting signal which selects a plurality of blocks in the selected cell array.

It is also possible that when a refresh signal is supplied externally, the first word line selecting circuit outputs a first word line selecting signal which selects all of blocks in the selected cell array.

It is also possible that the first word line selecting circuit comprises: a gate circuit for outputting the first word line selecting signal in response to an output from the second selecting circuit; and a boosting driver for boosting an output from the gate circuit.

It is also possible that the boosting driver further comprises: a level shifter circuit for shifting an output level of the gate circuit; and a switching circuit for outputting a boosted voltage signal or a low voltage signal in accordance with an output level of the level shifter circuit.

It is also possible that the second word selecting circuit comprises a selecting circuit for outputting a second word line selecting signal which selects a second word line in accordance with an output from the second selecting circuit.

It is also possible that the second word selecting circuit comprises: a gate circuit for outputting a second word line selecting signal which selects a second Word line in accordance with an output from the second selecting circuit; and a boosting driver for boosting an output from the gate circuit.

It is also possible that the boosting driver further comprises: a level shifter circuit for shifting an output level of the gate circuit; and a switching circuit for outputting a high voltage signal or a low voltage signal in accordance with an output level of the level shifter circuit.

It is also possible that the word driver comprises an AND circuit for taking an AND-logic of the first word line selecting signal and the second word line selecting signal.

It is also possible that the AND circuit comprises a switching circuit for performing an ON/OFF control of the second word line selecting signal in accordance with the first word line selecting signal.

It is also possible that the AND circuit comprises a switching circuit for boosting the second word line selecting signal and outputting the boosted signal or for outputting the second word line selecting signal as a low level signal.

It is also possible that the AND circuit comprises: a flip-flop circuit driven by a boosted voltage; a first switching circuit driven by the first word line selecting signal for placing the flip-flop circuit into an enable state; and a second switching circuit for driving the flip-flop circuit in accordance with the second word line selecting signal when the flip-flop circuit is in the enable state.

It is also possible that the AND circuit comprises: a first circuit comprising a series connection of a load, a first switching circuit driven by the first word line selecting signal, and a second switching circuit driven by the second word line selecting signal; a second circuit outputting a boosted voltage signal or a low voltage signal in accordance with a voltage of a connecting point between the load and the first switching circuit.

It is also possible that the AND circuit comprises: a transistor having a gate supplied with the first word line selecting signal, a source applied with the second word line selecting signal, and a drain connected through a load to a power voltage; and a circuit selectively outputting a boosted voltage signal or a low voltage signal in accordance with a voltage of the drain of the transistor.

It is also possible that a read/write operation and a refresh operation are conducted in one memory cycle.

The present invention also provides a semiconductor memory device with a plurality of cell arrays having a plurality of memory cells which need refresh operations, and the semiconductor memory device has an address input means for outputting an internal address in response to an external address signal; a plurality of first selecting circuits provided for the plurality of cell arrays; a second selecting circuit being electrically coupled to the address input means for supplying a common selecting signal to the plurality of first selecting circuits based on the internal address signal from the address input means, wherein in a refresh operation, the second selecting circuit does not select at least one cell array of the plurality of cell arrays and does select the remaining of the plurality of cell arrays, and the first selecting circuit batch-selects a plurality of word lines.

It is possible that the second selecting circuit does select one cell array of the plurality of cell arrays.

It is also possible that the first selecting circuit has a first word line selecting circuit outputting first word line selecting signals, and a second word line selecting circuit outputting second word line selecting signals, the first word line selecting signal comprises selecting signals to be entered into a plurality of word drivers, and the second word line selecting signal comprises a selecting signal to be entered into a plurality of word drivers, into which respective selecting signals of the first word line selecting signal entered, and the second word line selecting signal is common to a plurality of the first word line selecting signal.

It is also possible to further comprise: a boost circuit for selectively supplying a boosted potential to only a first selecting circuit of the selected cell array in the plurality of first selecting circuits.

It is also possible that in a data read operation and a data write operation to the memory cells, each of the first and second word line selecting circuits outputs respective one signal.

It is also possible that each of the plurality of cell arrays is divided into a plurality of blocks, and each of the plurality of blocks has a data read means connected to drain terminals of the memory cells.

It is also possible that the plurality of word line selecting signals batch-selected in a refresh operation are to select the same number of word lines for every the blocks.

It is also possible that the address input means comprises a gate circuit for making an ON/OFF control of the external address signal based on a chip selecting signal.

It is also possible that when a refresh signal is supplied externally, the first word line selecting circuit outputs a first word line selecting signal which selects a plurality of blocks in the selected cell array.

It is also possible that when a refresh signal is supplied externally, the first word line selecting circuit outputs a first word line selecting signal which selects all of blocks in the selected cell array.

It is also possible that the first word line selecting circuit comprises: a gate circuit for outputting the first word line selecting signal in response to an output from the second selecting circuit; and a boosting driver for boosting an output from the gate circuit.

It is also possible that the boosting driver further comprises: a level shifter circuit for shifting an output level of the gate circuit; and a switching circuit for outputting a boosted voltage signal or a low voltage signal in accordance with an output level of the level shifter circuit.

It is also possible that the second word selecting circuit comprises a selecting circuit for outputting a second word line selecting signal which selects a second word line in accordance with an output from the second selecting circuit.

It is also possible that the second word selecting circuit comprises: a gate circuit for outputting a second word line selecting signal which selects a second word line in accordance with an output from the second selecting circuit; and a boosting driver for boosting an output from the gate circuit.

It is also possible that the boosting driver further comprises: a level shifter circuit for shifting an output level of the gate circuit; and a switching circuit for outputting a high voltage signal or a low voltage signal in accordance with an output level of the level shifter circuit.

It is also possible that the word driver comprises an AND circuit for taking an AND-logic of the first word line selecting signal and the second word line selecting signal.

It is also possible that the AND circuit comprises a switching circuit for performing an ON/OFF control of the second word line selecting signal in accordance with the first word line selecting signal.

It is also possible that the AND circuit comprises a switching circuit for boosting the second word line selecting signal and the boosted signal or outputting the second word line selecting signal as a low level signal.

It is also possible that the AND circuit comprises: a flip-flop circuit driven by a boosted voltage; a first switching circuit driven by the first word line selecting signal for placing the flip-flop circuit into an enable state; and a second switching circuit for driving the flip-flop circuit in accordance with the second word line selecting signal when the flip-flop circuit is in the enable state.

It is also possible that the AND circuit comprises: a first circuit comprising a series connection of a load, a first switching circuit driven by the first word line selecting signal, and a second switching circuit driven by the second word line selecting signal; and a second circuit outputting a boosted voltage signal or a low voltage signal in accordance with a voltage of a connecting point between the load and the first switching circuit.

It is also possible that the AND circuit comprises: a transistor having a gate supplied with the first word line selecting signal, a source applied with the second word line selecting signal, and a drain connected through a load to a power voltage; and a circuit selectively outputting a boosted voltage signal or a low voltage signal in accordance with a voltage of the drain of the transistor.

It is also possible that a read/write operation and a refresh operation are conducted in one memory cycle.

The present invention also provides a selecting circuit which receives inputs of first and second selecting signals and boosts the second selecting signal and outputs a boosted voltage signal or outputs a low level signal in accordance with the first selecting signal, wherein the selecting circuit comprises: a flip-flop circuit driven by a boosted voltage; a first switching circuit driven by the first selecting signal for placing the flip-flop circuit into an enable state; and a second switching circuit for driving the flip-flop circuit in accordance with the second selecting signal when the flip-flop circuit is in the enable state.

It is also possible that the selecting circuit comprise a decoder circuit, and the first and second selecting signals comprise decode signals.

It is also possible that the selecting circuit comprise a word decoder circuit, and the first and second selecting signals comprise word decode signals.

The present invention also provides a selecting circuit which receives inputs of first and second selecting signals and boosts the second selecting signal and outputs a boosted voltage signal or outputs a low level signal in accordance with the first selecting signal, wherein the selecting circuit comprises: a first circuit comprising a series connection of a load, a first switching circuit driven by the first selecting signal, and a second switching circuit driven by the second selecting signal; and a second circuit outputting a boosted voltage signal or a low voltage signal in accordance with a voltage of a connecting point between the load and the first switching circuit.

It is also possible that the selecting circuit comprise a decoder circuit, and the first and second selecting signals comprise decode signals.

It is also possible that the selecting circuit comprise a word decoder circuit, and the first and second selecting signals comprise word decode signals.

The present invention also provides a selecting circuit which receives inputs of first and second selecting signals and boosts the second selecting signal and outputs a boosted voltage signal or outputs a low level signal in accordance with the first selecting signal, wherein the selecting circuit comprises: a transistor having a gate supplied with the first selecting signal, a source applied with the second selecting signal, and a drain connected through a load to a power voltage; and a circuit selectively outputting the boosted voltage signal or the low voltage signal in accordance with a voltage of the drain of the transistor.

It is also possible that the selecting circuit comprise a decoder circuit, and the first and second selecting signals comprise decode signals.

It is also possible that the selecting circuit comprise a word decoder circuit, and the first and second selecting signals comprise word decode signals.

The present invention also provides a method of refreshing memory cells of a plurality of cell arrays of a semiconductor memory device, wherein at least one cell array of the plurality of cell arrays is not selected and the remaining of the plurality of cell arrays are selected, and a plurality of word lines of the selected at least one cell array are batch-selected.

It is also possible that one cell array is selected in the plurality of cell arrays.

It is also possible that the word lines in the selected cell array are selected based on a plurality of first word line selecting signals entered into a plurality of word drivers, and a second word line selecting signal as a common selecting signal to the plurality of first word line selecting signals.

It is also possible that a boosted potential is selectively supplied to only a word driver which drives word lines of the selected cell array.

It is also possible that each of the plurality of cell arrays is divided into a plurality of blocks, and each of the plurality of blocks has a data read means connected to drain terminals of the memory cells, and the plurality of word line selecting signals batch-selected in a refresh operation are to select the same number of word lines for every the blocks.

It is also possible that an ON/OFF control of an external address signal is made based on a chip selecting signal to supply an internal address.

It is also possible that when a refresh signal is supplied externally, a first word line selecting signal which selects a plurality of blocks in the selected cell array is outputted.

It is also possible that when a refresh signal is supplied externally, a first word line selecting signal which selects all of blocks in the selected cell array is outputted.

It is also possible that a read/write operation and a refresh operation are conducted in one memory cycle.

MODE FOR CARRYING OUT THE INVENTION (First Embodiment)

Figure 1:
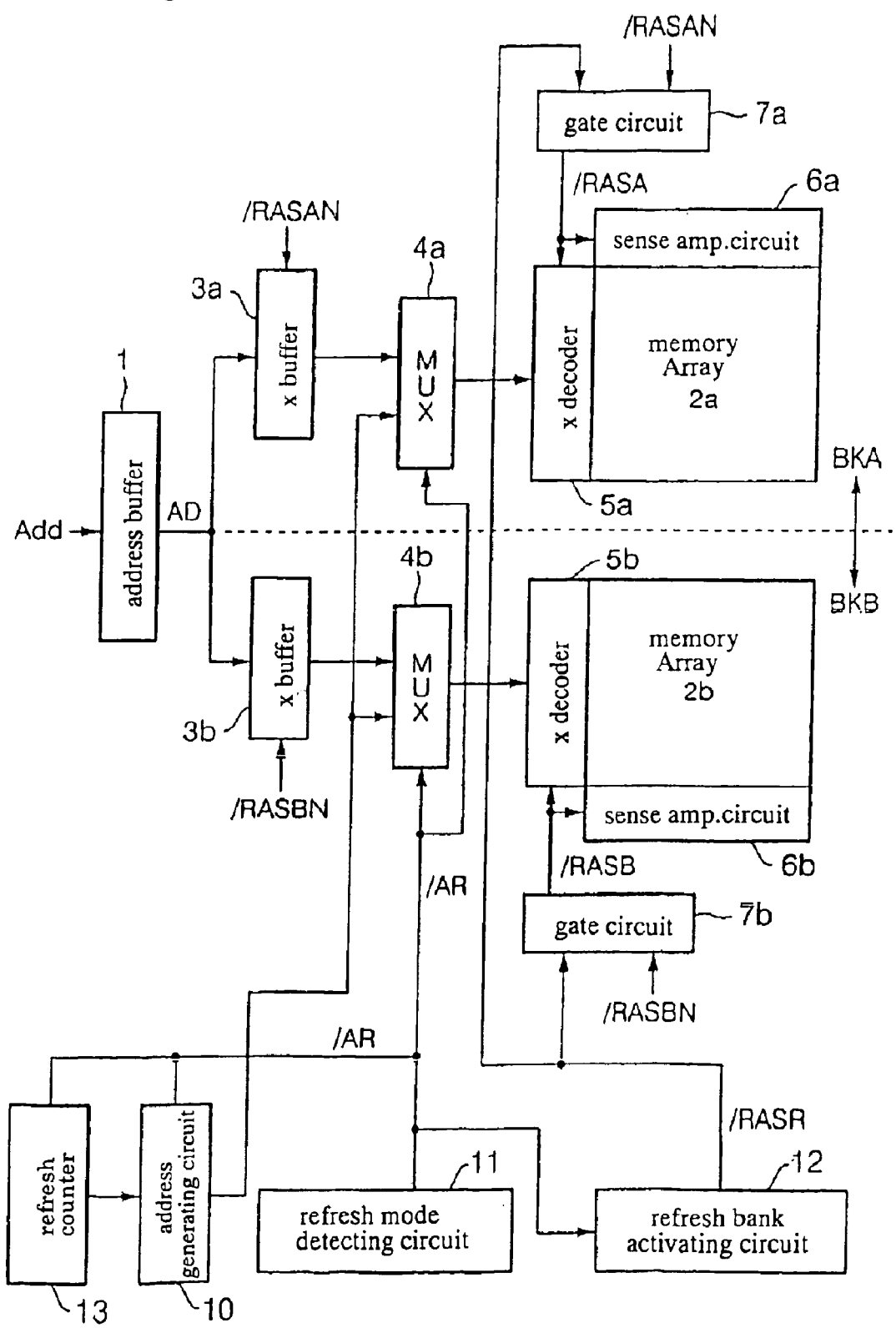
FIG. 1 is a block diagram illustrative of a structural example of the conventional semiconductor memory device.
Figure 2:
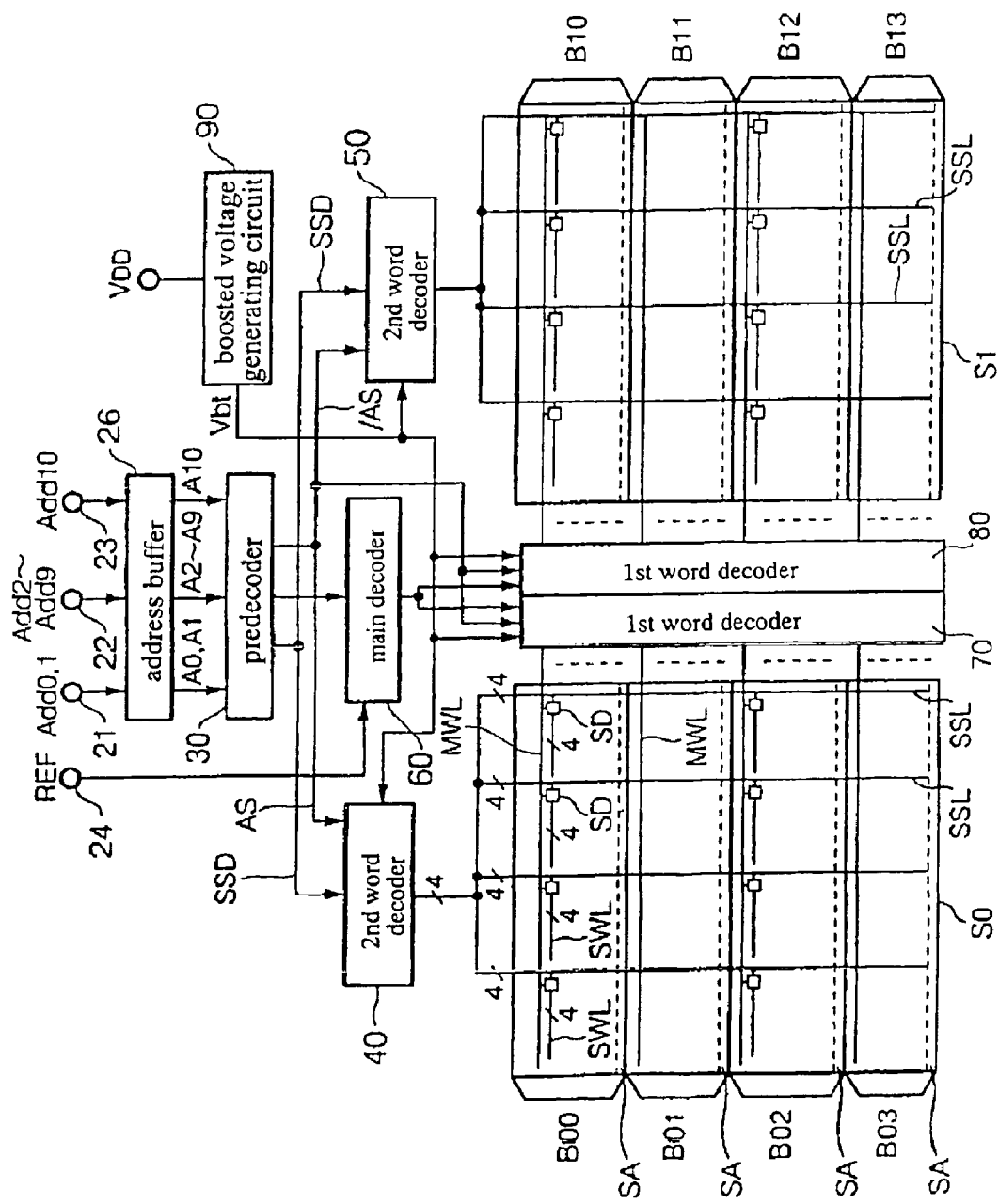
FIG. 2 is a block diagram illustrative of an essential part of a semiconductor memory device in accordance with a first embodiment of the present invention.

Embodiments of the present invention will, hereinafter, be described with reference to the drawings. FIG. 2 is a block diagram illustrative of an essential part of a semiconductor memory device (a pseudo SRAM) in accordance with a first embodiment of the present invention. Cell arrays S0 and S1 of the pseudo SRAM are cell arrays having the same structure as the DRAM, and other circuit blocks constitute a peripheral circuit.

First, the cell arrays S0 and S1 will be described. A first cell array S0 comprises four blocks B00~B03. In each block, each sense amplifier SA is formed. In each of the blocks B00~B03, sixty four of a first word line MWL extend in a lateral direction. Four of a third word line SWL with a length of about one quarter of the first word line MWL extend along the each first word line MWL. A third word decoder SD is formed at a terminal of the third word line SWL. In this cell array S0, four of a second word line SSL extend in a longitudinal direction at a uniform distance.

Figure 3:
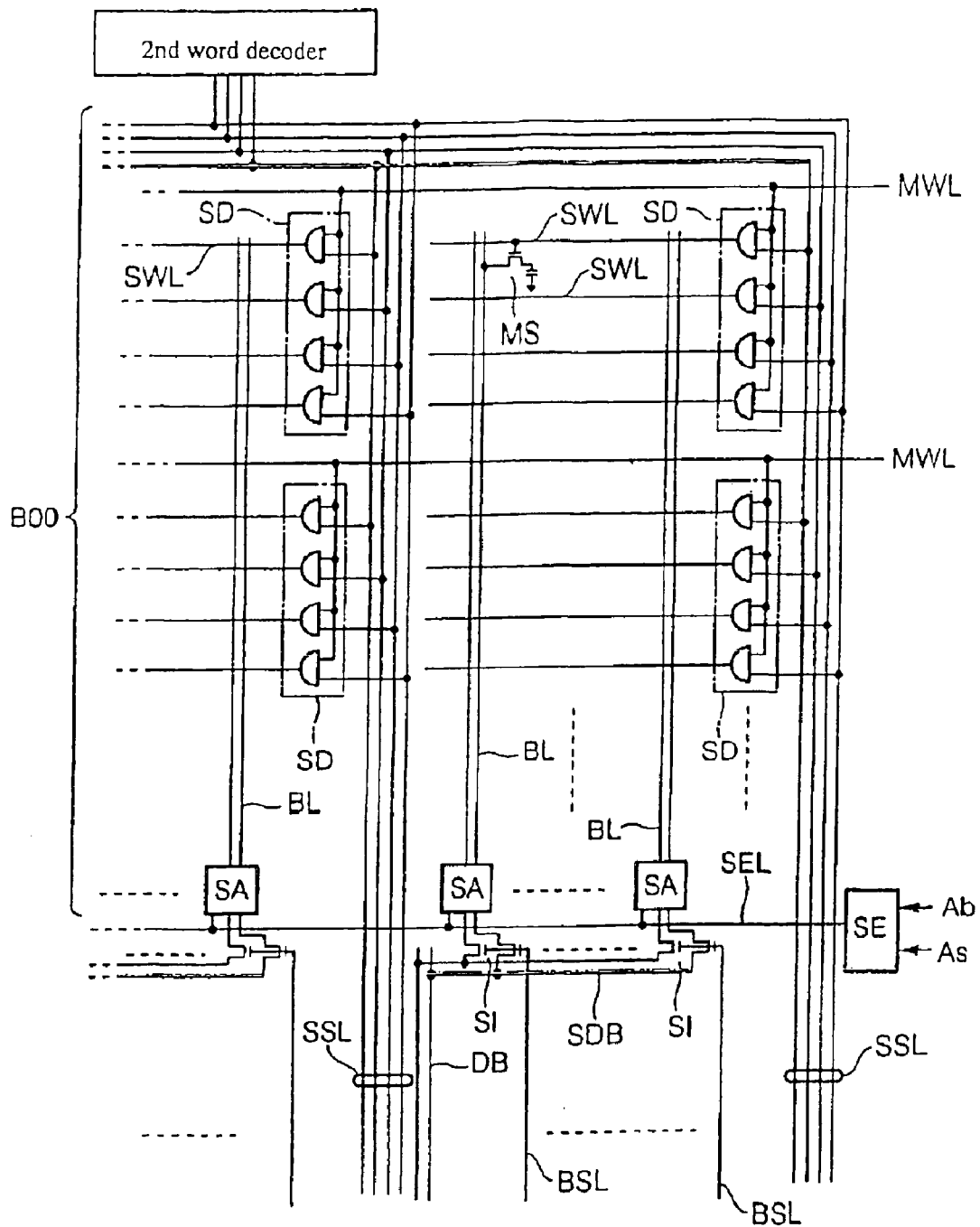
FIG. 3 is a circuit diagram illustrative of a partial structure of a cell array S0 in FIG. 2.

FIG. 3 is a view of a partial structure of the block B00. The third word decoder SD comprises four of an AND circuit the each third word line SWL is connected to an output terminal of the each AND circuit a first input terminal of the each AND circuit is connected to the first word line MWL, and a second input terminal of the each AND circuit is connected to four of the second word line SSL. A memory cell MS is connected to the each third word line SWL.

In accordance with this structure, if one of the first word line MWL is activated, then four of the third word decoder SD are selected by the one first word line. One of the four AND circuits of the third word decoder is selected by the second word line SSL, whereby the third word line SWL connected to the selected AND circuit is activated. Namely, if one of the first word line MWL is activated, then four of 4 by 4 of the third word line SWL belonging thereto are activated.

Figure 4:
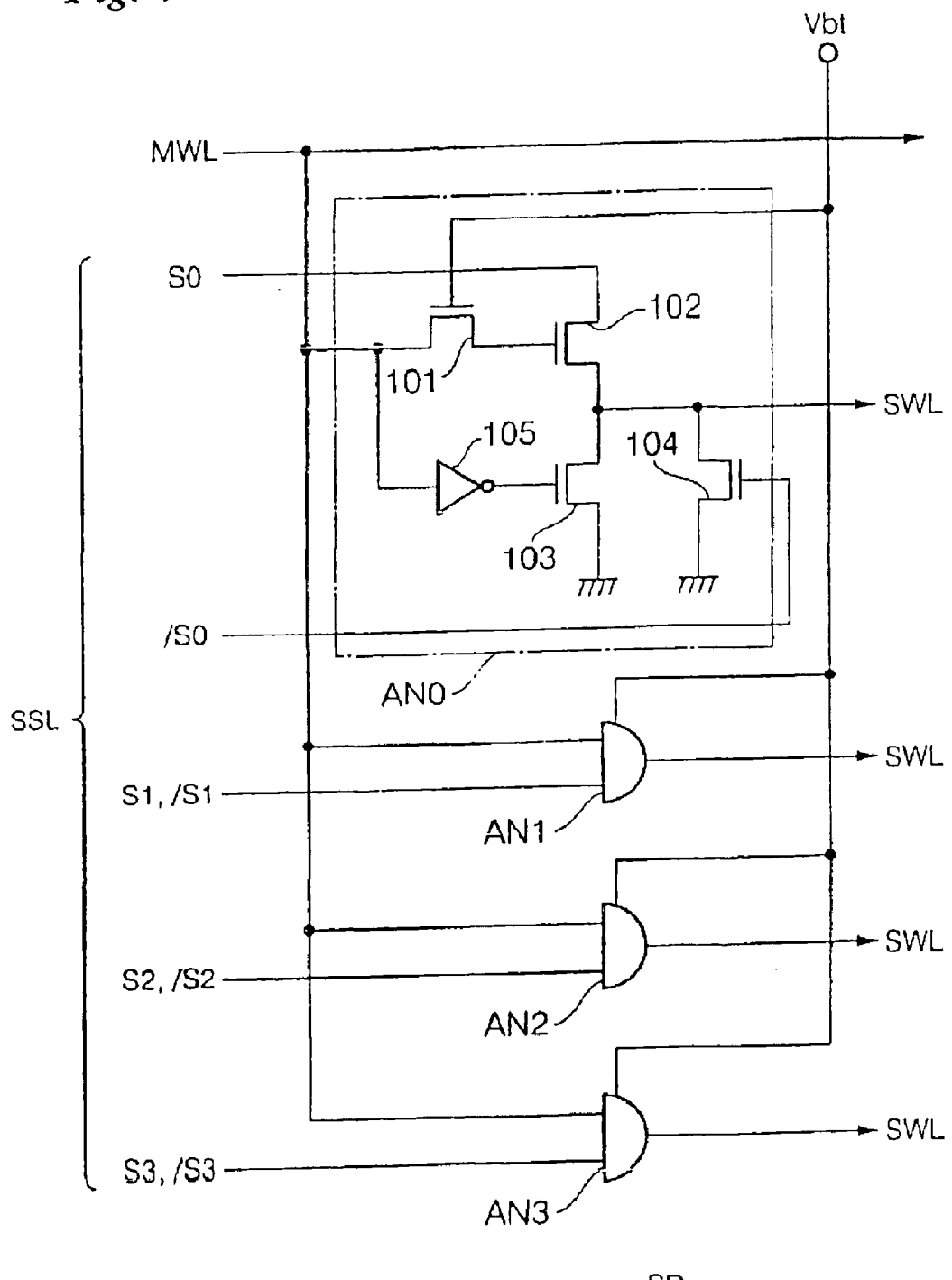
FIG. 4 is a circuit diagram illustrative of a structure of a third word decoder SD.

FIG. 4 is a circuit diagram illustrative of a detailed structure of the above-described third word decoder SD. As shown in this figure, the third word decoder SD comprises four AND gates AN0~AN3. Each of the AND gate AN0~AN3 comprises n-channel FETs 101~104 and an inverter 105. The first word line MWL is connected to a source of the FET 101 and also to an input terminal of the inverter 105. A gate of the FET 101 is applied with a boosted voltage Vbt. A drain of the FET 101 is connected to a gate of the FET 102. A signal S0 is applied to a source of the FET 102. An output from the inverter 105 is applied to a gate of the FET 103. A source of the FET 102 is connected commonly to drains of the FETs 103 and 104. The signal /S0 is applied to the gate of the FET 104. Sources of the FETs 103 and 104 are grounded. A signal at a common connecting point of the FETs 102~104 is applied to the third word line SWL shown in FIG. 3.

The boosted voltage Vbt is a voltage boosted from a power voltage, and the boosted voltage is generated by a boosted voltage generating circuit which boosts the power voltage, which will be described later. The signals S0 and /S0 may be obtained from the single line of the second word line SSL. Namely, the second word line SSL comprises eight lines. Notwithstanding, the illustration thereof represent only four lines for simplification.

In the above structure, if the signal on the first word line MWL is "0", then the output from the inverter 105 is "1", whereby the FET 103 turns ON. Independent from the values of the signals S0 and /S0, the value "0" is supplied to the third word line SWL. If the signal on the first word line MWL is "1", then the output from the inverter 105 is "0", whereby the FET 103 turns OFF, while the FETs 101 and 102 turn ON. Namely, if the signal S0 is "1", then the value "1" is supplied to the third word line SWL, whereby this word line is activated. If the signal S0 is "0", then the value "0" is supplied to the third word line SWL.

Figure 5:
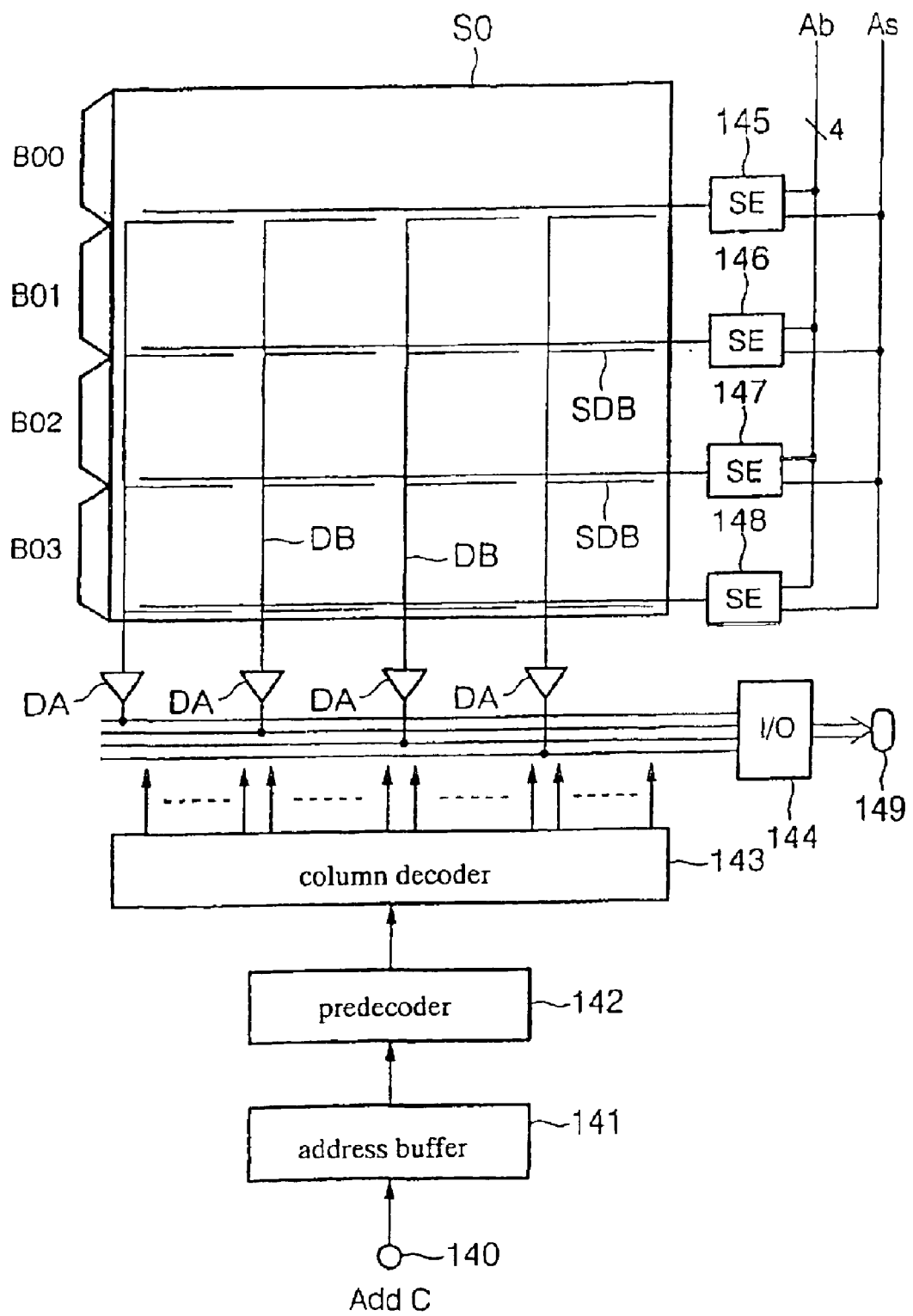
FIG. 5 is a block diagram illustrative of a data-read-circuit for a cell array S0 in FIG. 2.

Subsequently, as shown in FIG. 5, in the cell array S0, four data buses DB extend in the longitudinal direction at a uniform distance. Each of the data buses DB is connected with four sub-data buses SDB. Even the illustration is omitted in FIG. 5, the cell array S0 has a large number of bit selecting lines BSL extending in the longitudinal direction (see FIG. 3). Each of the bit selecting lines BSL is connected to each output terminal of a column decoder 143.

As shown in FIG. 3, in the block B00, bit lines BL extend in the longitudinal direction. Sense amplifiers SA are formed at the terminals of the respective bit lines BL. An amplified output from the sense amplifier SA is supplied through a switching device SI to the sub-data bus SDB. An ON/OFF control terminal of the switching device SI is connected to the above-described bit selecting line BSL. A sense enable line SEL (FIG. 3) is provided at the bottom of the block B00. The sense amplifiers SA in the block B00 are connected to the sense enable line SEL.

The structure of the block B00 has been described above. The structure of the blocks B01~B03 is similar to the above. The structure of the respective blocks B10~B13 of the cell array S1 is also similar to the above. The structure of the cell array S1 is similar to the above-described structure of the cell array S0.

Subsequently, the peripheral circuit will be described. In FIG. 2, terminals 21~23 are applied with addresses Add0~Add10 which select word lines. The terminal 21 is applied with the addresses Add0 and Add1. The terminal 22 is applied with the addresses Add2~Add9. The terminal 23 is applied with the address Add10. The address Add10 is the most significant bit of the Address Add and is to select either the cell array S0 or S1. If the address Add10 is "1", then the cell array S0 is selected. If the address Add10 is "0", then the cell array S1 is selected.

The addresses Add2~Add7 are to select a single line of sixty four of the first word line MWL in each of the blocks B00~B03 and B10~B13. The address Add8 is to select any one of the blocks B00~B03, and the address Add9 is to select any one of the blocks B10~B13. The addresses Add0 and Add1 are to select one of the second word lines SSL. The terminal 24 is applied with a refresh signal REF. This refresh signal REF is outputted from a refresh control circuit (not illustrated) at refresh timings of the cell arrays. In the normal operation mode, the refresh signal is "0". In the refresh mode, the refresh signal is "1".

An address buffer 26 buffers the addresses Add0~Add10 applied to the terminals 21~23, and outputs address data A0~A10. A pre-decoder 30 is connected to the address buffer 26 for decoding the address data A0 and A1 and outputting a signal SSD of four bits. The pre-decoder 30 also decodes the address data A2~A9 and outputs the same. The pre-decoder 30 also outputs a signal AS amplified from the address data A10 and its inversion signal /AS.

Two second word decoders 40 and 50 are connected to the pre-decoder 30 for receiving the four-bits signal SSD obtained by decoding the address data A0 and A1. A main decoder 60 is connected to the pre-decoder 30 for receiving outputs obtained by decoding the address data A2~A9. The first word decoder 70 and the second word decoder 40 are connected to the pre-decoder 30 for receiving the signal AS obtained by amplifying the address data A10. A first word decoder 80 and a second word decoder 50 are connected to the pre-decoder 30 for receiving the inversion signal /AS.

The main decoder 60 further decodes the output from the pre-decoder 30 and supplies the decoded signal to the first word decoder 80 and the second word decoder 50. If the refresh signal REF is "1", then the main decoder 60 outputs a signal which designates a plurality of block from the blocks B00~B03 and B10~B13. The first word decoder 70 selects and activates the first word line MWL of the cell array S0 based on the output from the main decoder 60. Similarly, the first word decoder 80 selects and activates the first word line MWL of the cell array S1 based on the output from the main decoder 60.

The second word decoder 40 conducts a level-conversion and an amplification of the four-bits signal SSD outputted from the pre-decoder 30 and then supplies the signal to the second word line SSL of the cell array S0 if the signal AS is "1". Similarly, the second word decoder 50 conducts a level-conversion and an amplification of the four-bits signal SSD outputted from the pre-decoder 30 and then supplies the signal to the second word line SSL of the cell array S1 if the signal /AS is "1". A boosted voltage generating circuit 90 boosts the power voltage VDD and outputs the boosted voltage Vbt.

Figure 6:
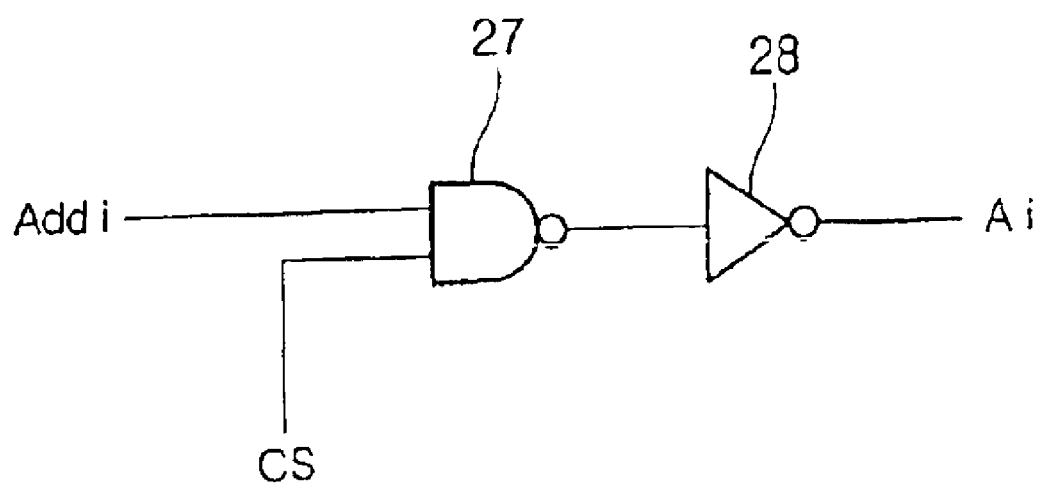
FIG. 6 is a circuit diagram illustrative of a structure of an address buffer 26 in FIG. 2.

The above-described circuit will further be described in more details with reference to the drawings. The address buffer 26, as shown in FIG. 6, comprises an NAND gate 27 and an inverter 28. If a chip select signal CS is "1", then the address Addi (i=0~10) is amplified, and address data Ai (i=0~10) are outputted.

Figure 7:
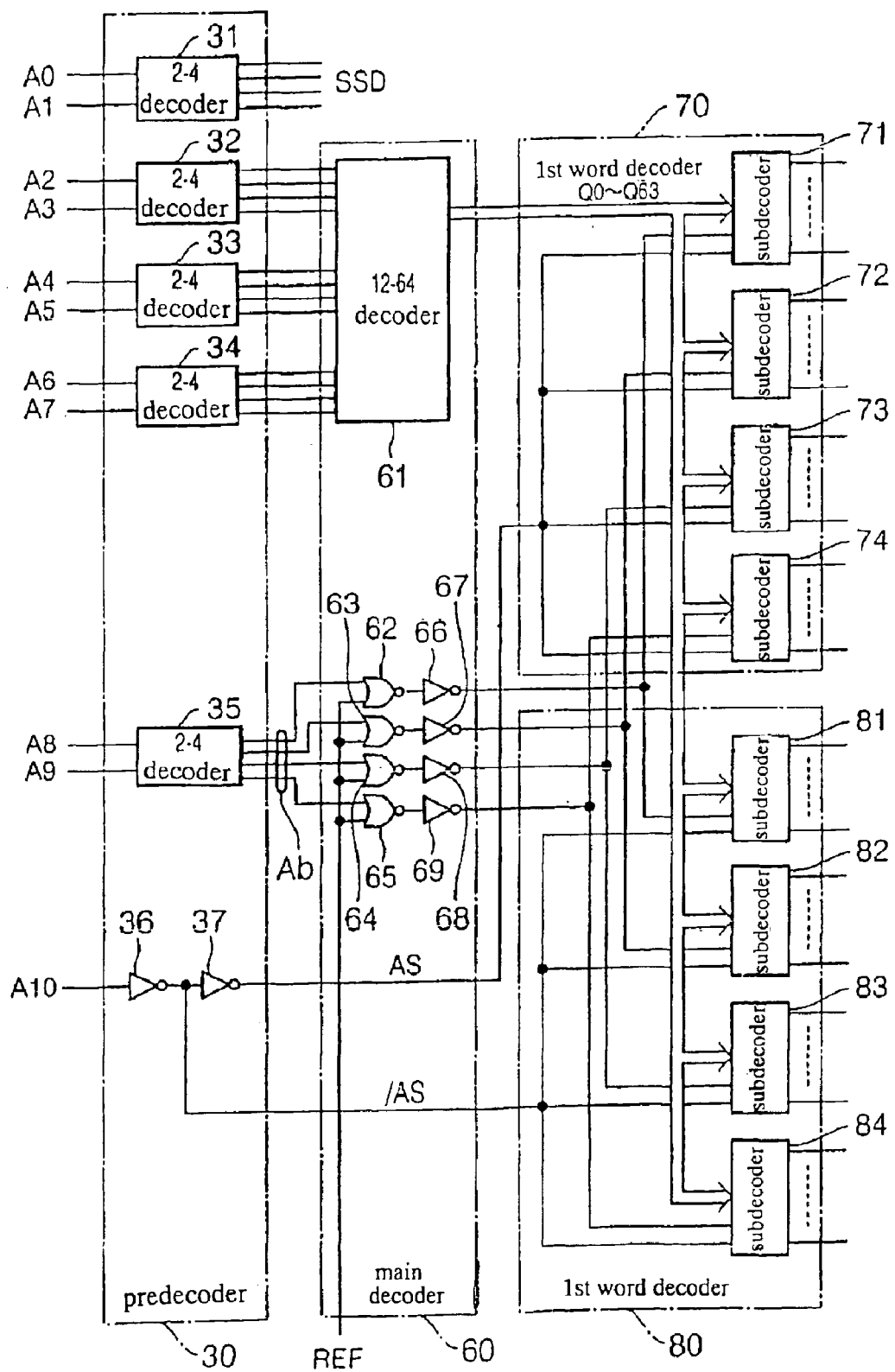
FIG. 7 is a block diagram illustrative of structures of a pre-decoder 30, a main decoder 60, and first word decoders 70 and 80 in the same embodiment.

As shown in FIG. 7, the pre-decoder 30 comprises a 2-4 decoder 31 decoding the address data A0 and A1, a 2-4 decoder 32 decoding the address data A2 and A3, a 2-4 decoder 33 decoding the address data A4 and A5, a 2-4 decoder 34 decoding the address data A6 and A7, a 2-4 decoder 35 decoding the address data A8 and A9 and outputting a decode result as a block selecting signal Ab, an inverter 36 inverting the address data A10 and outputting an inversion result as a cell array selecting signal /AS which selects the cell array S1 and an inverter 37 inverting the output from the inverter 36 and outputting an inversion result as a cell array selecting signal AS which selects the cell array S0. The output signal SSD from the 2-4 decoder 31 is supplied to the second word decoders 40 and 50. Outputs from the 2-4 decoders 32~35 are supplied to the main decoder 60. The output signal AS from the inverter 37 is supplied to the first word decoder 70 and the second word decoder 40. The output signal /AS from the inverter 36 is supplied to the first word decoder 80 and the second word decoder 50.

Figure 8:
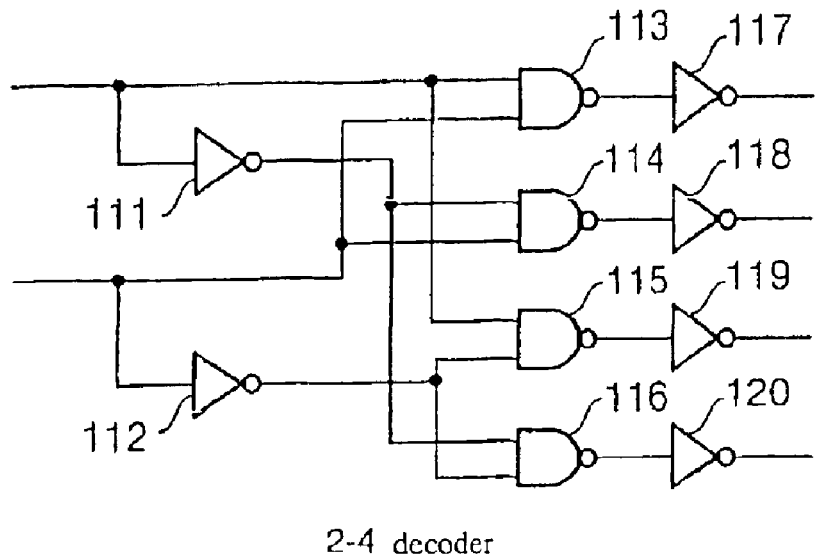
FIG. 8 is a circuit diagram illustrative of structures of 2-4 decoders 31~35 in FIG. 7.

FIG. 8 is a circuit diagram illustrative of the structure of the 2-4 decoder. The 2-4 decoder comprises inverters 111 and 112 inverting input signals, NAND gates 113~116 receiving the input signals and outputs from the inverters 111 and 112, and inverters 117~120 inverting outputs from the NAND gates 113~116. The 2-4 decoder decodes the input signals and outputs those decoded results.

Figure 9:
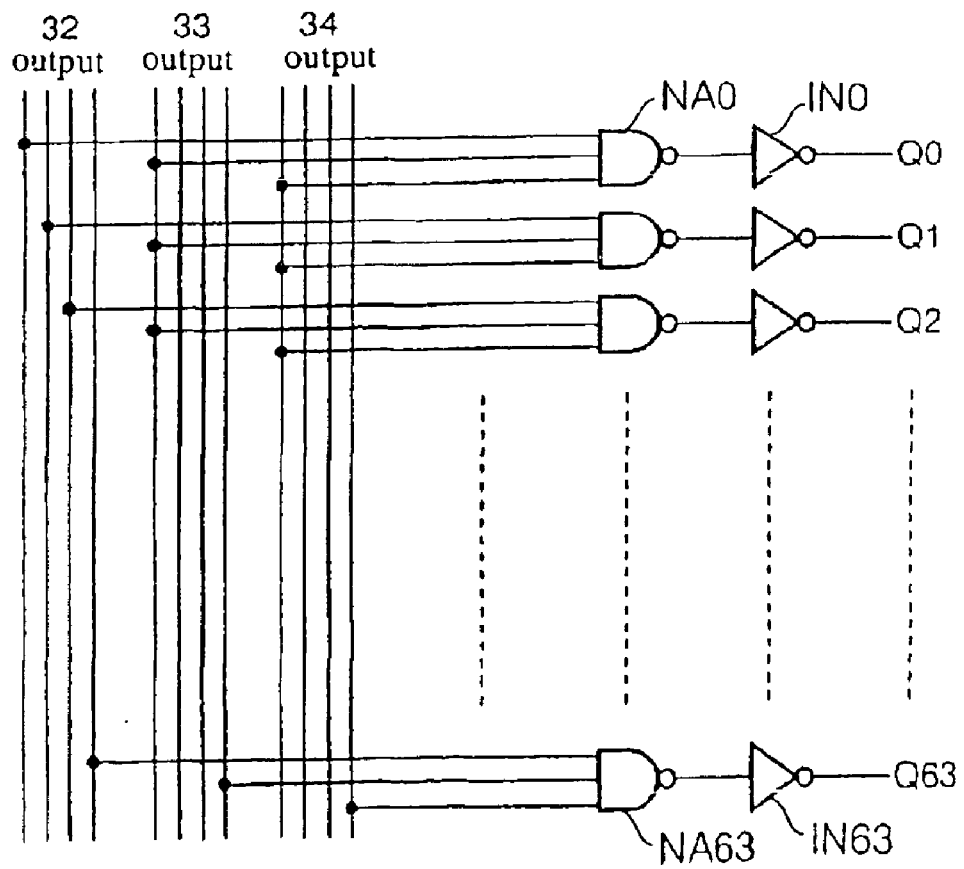
FIG. 9 is a circuit diagram illustrative of a structure of 12-64 decoder 61 in FIG. 7.

As shown in FIG. 7, the main decoder 60 comprises a 12-64 decoder 61, NOR gates 62~65, and inverters 66~69. The 12-64 decoder 61 decodes 12-bits data outputted from the 2-4 decoders 32~34 in the pre-decoder 30 and outputs 64-bits data. As shown in FIG. 9, the 12-64 decoder 61 comprises 3-inputs NAND gates NA0~NA63, and inverters IN0~IN63 for inverting outputs from the respective NAND gates NA0~NA63. Outputs Q0~Q63 from the inverters IN0~IN63 are supplied to the first word decoders 70 and 80. As can be seen from the above-descriptions, the circuit shown in FIG. 7 is that the 6-bits address data A2~A7 are decoded by the 2-4 decoders 32~34 and the 12-64 decoder 61 to generate the 64-bits data.

Respective first input terminals of the OR gates 62~65 are applied with respective outputs from the 2-4 decoder 35, and respective second input terminals of the OR gates 62~65 are applied with the refresh signal REF. If the refresh signal is "0", then the outputs from the 2-4 decoder 35 are transmitted through the OR gates 62~65 and the inverters 66~69 to the first word decoders 70 and 80. If the refresh signal is "1", then independent from the outputs from the outputs from the 2-4 decoder 35, the value "1" are transmitted from the inverters 66~69 to the first word decoders 70 and 80 respectively.

Figure 10:
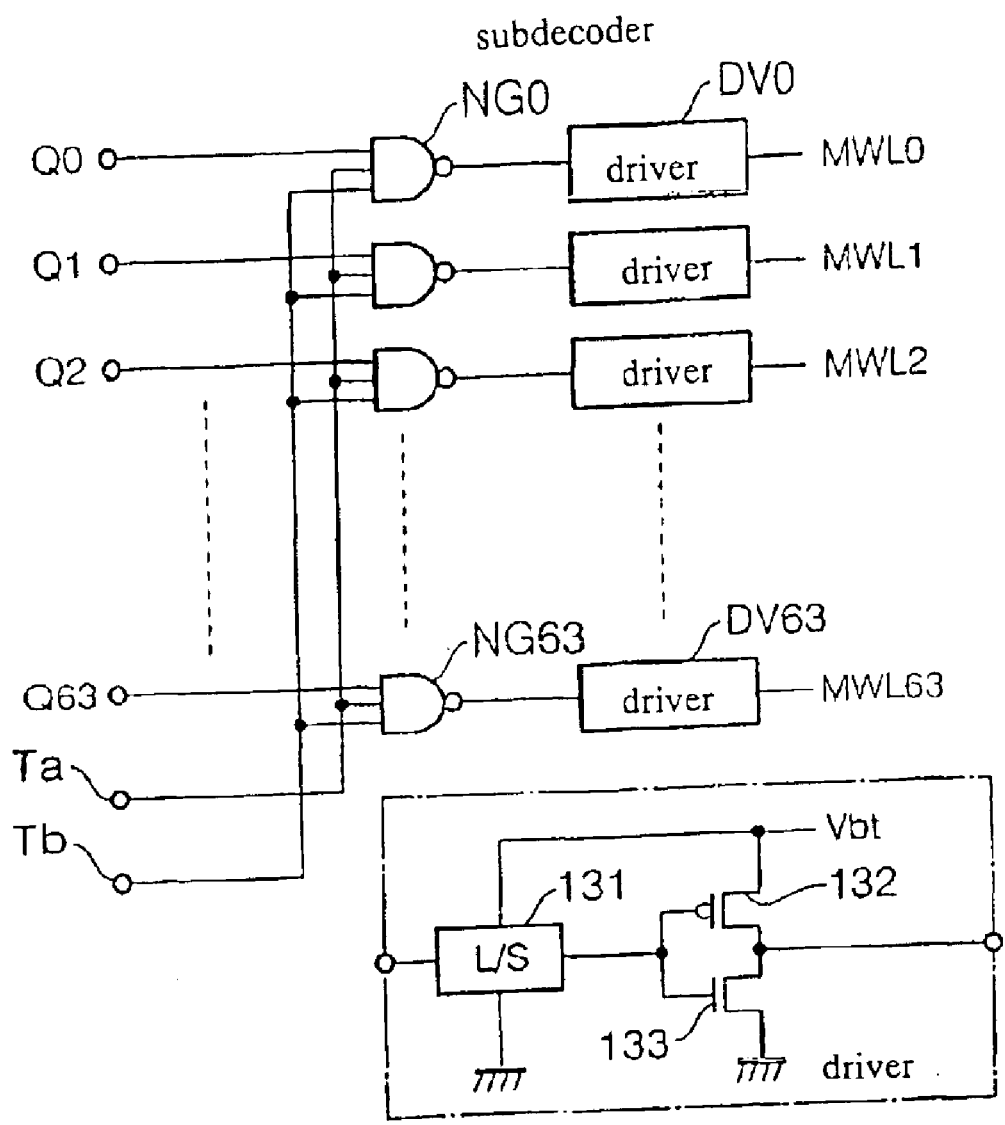
FIG. 10 is a circuit diagram illustrative of structures of sub-decoders 71~74 and 81~84.

The first word decoder 70 comprises sub-decoders 71~74. The first word decoder 80 comprises sub-decoders 81~84. FIG. 10 is a circuit diagram illustrative of the structure of the sub-decoder. As shown in this figure, the sub-decoder comprises sixty four 3-inputs NAND gates NG0~NG63, and drivers DV0~DV63 for level conversion and amplification of respective outputs from the NAND gates NG0~NG63.

Each of the drivers DV0~DV63 comprises a level converter circuit 131, a p-channel FET 132, and an n-channel FET 133. An output from the level converter circuit 131 is applied to gates of the FETs 132 and 133. The boosted voltage is supplied to the level converter circuit 131 and a source of the FET 132. A drain of the FET 132 is connected to a drain of the FET 133. A source of the FET 133 is also grounded. If outputs from the NAND gates NG0~NG63 are "1", then the voltage Vbt is outputted. If the outputs from the NAND gates NG0~NG63 are "1", then the ground voltage is outputted.

The outputs Q0~Q63 from the 12-64 decoder 61 are applied to the first input terminals of the above NAND gates NG0~NG63 respectively. Respective second input terminals of the above NAND gates NG0~NG63 are commonly connected to terminals Ta. Respective third input terminals of the above NAND gates NG0~NG63 are also commonly connected to terminals Tb.

In FIG. 7, the outputs Q0~Q63 from the 12-64 decoder 61 are entered commonly to the sub-decoders 71~74 and the sub-decoders 81~84. The terminal Ta of the sub-decoder 71 and the terminal Ta of the sub-decoder 81 are commonly connected to an output terminal of the inverter 66. The terminal Ta of the sub-decoder 72 and the terminal Ta of the sub-decoder 82 are commonly connected to an output terminal of the inverter 67. The terminal Ta of the sub-decoder 73 and the terminal Ta of the sub-decoder 83 are commonly connected to an output terminal of the inverter 68. The terminal Ta of the sub-decoder 74 and the terminal Ta of the sub-decoder 84 are commonly connected to an output terminal of the inverter 69.

Terminals Tb of the sub-decoders 71~74 are commonly connected to an output terminal of the inverter 37. Terminals Tb of the sub-decoders 81~84 are commonly connected to an output terminal of the inverter 36. Respective output terminals of the sub-decoder 71 are connected to respective first word lines MWL in the block B00 in the cell array S0. Similarly, respective output terminals of the sub-decoders 72~74 are connected to respective first word lines MWL in the blocks B01~B03 in the cell array S0. Respective output terminals of the sub-decoders 81~84 are connected to respective first word lines MWL in the blocks B10~B13 in the cell array S1.

Figure 11:
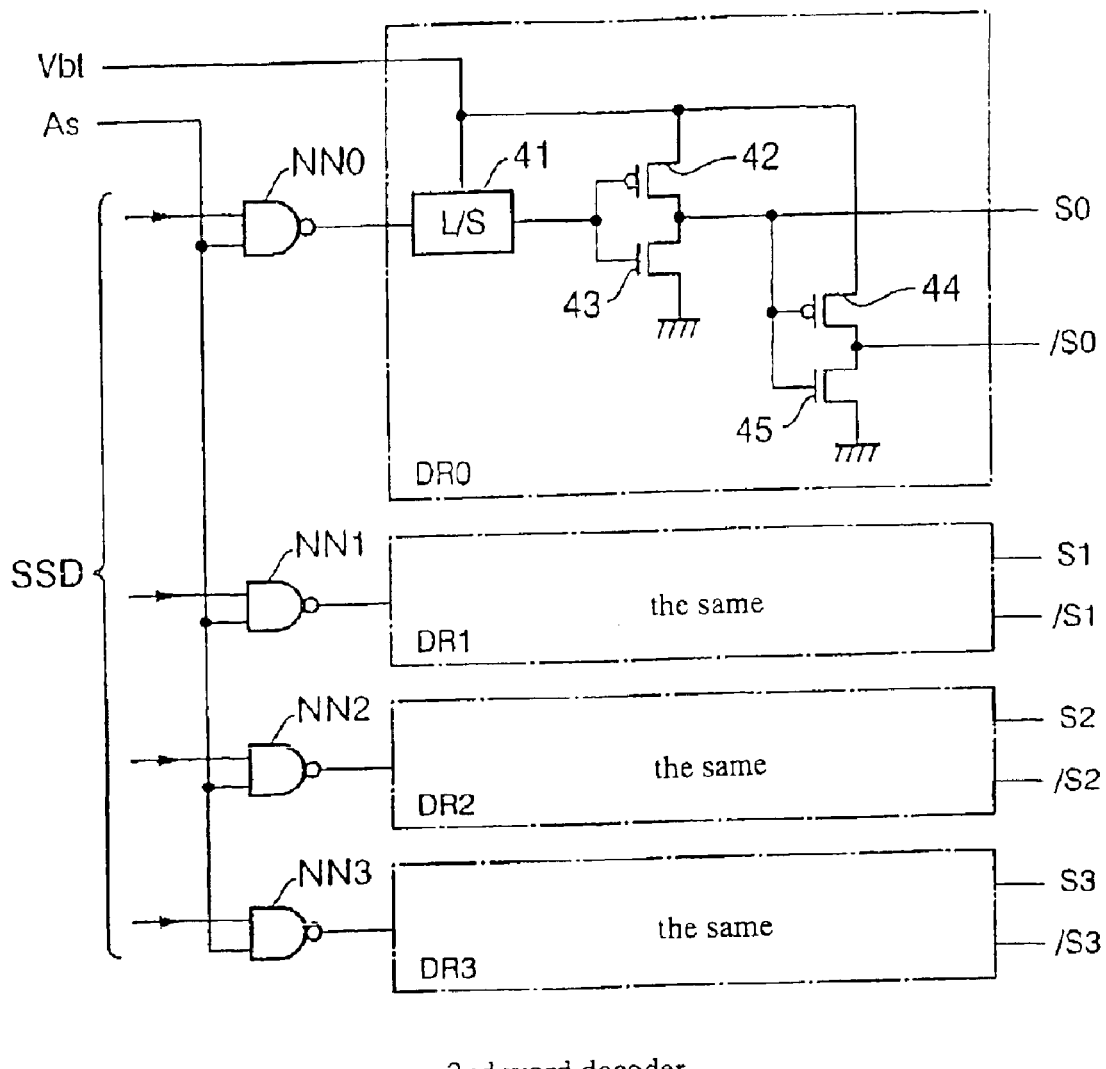
FIG. 11 is a circuit diagram illustrative of structures of second word decoders 40 and 50 in FIG. 2.

The second word decoder 40 shown in FIG. 2 comprises four 2-inputs NAND gates NN0~NN3, and drivers DR0~DR3 for level conversions and amplifications of outputs from the NAND gates NN0~NN3, as shown in FIG. 11. The signal AS is applied to respective first input terminals of the NAND gates NN0~NN3. Output signals SSD from the 2-4 decoder 31 of the pre-decoder 30 shown in FIG. 7 are applied to respective second input terminals of the NAND gates NN0~NN3. If the signal AS is "1", then the above signals SSD are supplied through the NAND gates NN0~NN3 to the drivers DR0~DR3, whereby the drivers DR0~DR3 are activated. If the signal AS is "0", then transmission of the above signals SSD are inhibited by the NAND gates NN0~NN3 and thus are not supplied to the drivers DR0~DR3, whereby the drivers DR0~DR3 are inactivated.

A driver DR0 comprises a level converter circuit 41, p-channel FETs 42 and 44 and n-channel FETs 43 and 45. An output terminal of the level converter circuit 41 is connected to gates of the FETs 42 and 43. The boosted voltage Vbt is supplied to the level converter circuit 41 and sources of the FETs 42 and 44. Drains of the FETs 42 and 43 are connected to each other and also connected commonly to gates of the FETs 44 and 45. A source of the FET 43 is grounded. Drains of the FETs 44 and 45 are connected to each other. A source of the FET 45 is grounded. The signal S0 as a signal of a common connecting point between the FETs 42 and 43 and the signal /S0 as another signal of another common connecting point between the FETs 44 and 45 (see FIG. 4) are supplied to the second word lines SSL in the cell array S0. The structure of the drivers DR1~DR3 is similar to the above-described structure of the driver DR0.

The second word decoder 50 has the same structure as the second word decoder 40, except that instead of the above-described signal AS, the signal /AS is supplied from the pre-decoder 30.

The structure of the circuit for selecting the word lines has been described above. The circuit for selecting bit lines will, hereinafter, be described.

In FIG. 5, a terminal 140 is applied with an address AddC which selects the bit line. The address AddC applied to this terminal 140 is then supplied through an address buffer 141 to a pre-decoder 142. The pre-decoder 142 pre-decodes the output from the address buffer 141 and supplies the pre-decoded signal to a column decoder 143. The column decoder 143 activates a bit selecting line BSL (see FIG. 3) which is designated by the output from the pre-decoder 142, whereby the switching devices SI connected to this bit selecting line BSL turn ON. he sense amplifiers connected to these switching devices SI are connected through bus-data buses SDB to the data bus DB. Data on the data bus DB are transmitted to a terminal 149 through the data amplifier DA (FIG. 5) and an I/O buffer 144.

In FIG. 5, each of sense amplifier activation circuits 145~148 receives the above-described block selecting signal Ab (see FIG. 7) and the selecting signal AS which selects the cell array S0. If the signal AS is "1", each of sense amplifier activation circuits 145~148 activates the sense amplifiers SA of the designated one of the blocks B00~B03 in the cell array S0, wherein the designated block was designated by the block selecting signal Ab.

Subsequently, operations of the above-described semiconductor memory device will be described.

In the normal data read/write operations, the refresh signal REF is "0". When the addresses Add~Add10 designating a word line are externally supplied to the terminals 21~23, then in accordance with these addresses Add0~Add10, the address buffer 26 transmits the addresses Add0~Add10 to the pre-decoder 30. Assuming that the address data A10 of the most significant bit is "1", the selecting signal AS selecting the cell array S0 (FIG. 7) is "1", while the selecting signal /AS selecting the cell array S1 is "0". As a result, the respective sub-decoders 71~74 of the first word decoder 70 becomes an activation-enable state, while the respective sub-decoders 81~84 of the first word decoder 80 are inactivated. If the signal AS is "1" and the signal /AS is "0", then the second word decoder 40 is activated, while the second word decoder 50 is inactivated.

If the address data A8 and A9 are, for example, "01" (2 in decimal number), "0010" as the block selecting signal Ab are outputted from the pre-decoder 30 in FIG. 7. At this time, the refresh signal REF is "0". Thus, for the block selecting signal Ab "0010", only an output from the inverter 68 in the outputs from the inverters 66~69 is "1", whereby only the sub-decoder 73 of the first word decoder 70 is activated, while the sub-decoders 71, 72 and 74 are inactivated. Namely, only the word lines of the block B02 in the cell array S0 become the activation-enable state.

If the address data A2~A7 are, for example, "001100" (12 in decimal number), only the output Q12 from the sub-decoder 73 is "1", whereby only the word line MWL12 in the first word lines MWL0~MWL63 in the block B02 is activated.

If the address data A0 and A1 are "10" (1 in decimal number), only the output from the NAND gate NN1 of the second word decoder 40 (FIG. 11) is "1", whereby only the driver DR1 is activated. As a result, the second line of the second word lines SSL (FIG. 3) is activated.

As described above, if the address data A0~A10 are "10001100011", then the first word line MWL12 in the second block B02 in the cell array S0 is activated, and the second line of the second word lines SSL is activated, whereby four third word lines SWL connected to the respective AND gates AN1 (FIG. 4) of four third word decoders SD connected to the first word line MWL12 are activated. At this time, the respective sense amplifiers SA of the block B02 are activated by the sense amplifier activation circuit 147. Data of the memory cells connected to the above-described four third word lines SWL are amplified by the sense amplifiers SA. The bit line BL is selected by the address AddC, and the data amplified by the sense amplifier SA connected to the selected bit line are read out and transmitted through the sub-data bus SDB to the data bus DB.

If the address data A10 is "0", then the selecting signal AS selecting the cell array S0 is "1", while the selecting signal /AS selecting the cell array S1 is "0". The first word decoder 70 and the second word decoder 40 are inactivated, while any word line in the cell array S1 is activated based on the address data A0~A9.

Subsequently, the refresh operations will be described. In the refresh operations, the refresh signal REF of "1" is outputted from the refresh control circuit (not illustrated). The refresh address is supplied to the terminals 21~23. If the address data A10 based on the refresh address is "1", then as described above, the first word decoder 80 and the second word decoder 50 are inactivated, while the respective word lines in the cell array S0 become the activation-enable state. If the refresh signal REF is "1", then every outputs from the NOR gates 62~65 shown in FIG. 7 are "0" independent from the values of the address data A8 and A9. Thus, every outputs from the sub-decoders 71~74 become the activation enable state. Namely, the every blocks B00~B03 become the activation enable state.

If the address data A0~A7 based on the refresh address are, for example, "00000000", then the respective first word lines MWL0 of the respective blocks B00~B03 are activated, and the first line from the top of the 4 by 4 third word lines belonging to each of the respective first word lines MWL0 is activated. The respective sense amplifiers SA of the blocks B00~B03 are activated by the sense amplifier activation circuits 145~148. Data of the memory cells connected to the above-described four third word lines SWL are amplified by the sense amplifiers SA and re-written, whereby the memory cells are refreshed.

After the refresh of the respective first lines of the third word lines in the respective blocks B00~B03 are completed, then the address data A0~A7 based on the refresh address become "10000000", whereby the second line of the third word line in each of the respective blocks B00~B03 is refreshed. The above operations will be repeated. After the refreshes of all of the word lines in the cell array S0, then a similar refresh operation to the cell array S1 will follow.

In the above-described embodiment, if the refresh signal REF is "1", then the refresh address is applied to the terminals 21~23. Four blocks in the single cell array are subjected to the simultaneous refresh operation, thereby reducing the number of refresh cycle and also reducing the power consumption for the refresh operations as compared to the prior art. Namely, if, in accordance with the prior art, word lines of a plurality of cell arrays are batch-refreshed, then it is necessary to activate both the first and second word decoders of the respective cell arrays. In accordance with the present invention, however, it is necessary to activate the first and second word decoders of only any one of the cell arrays for refresh operation, whereby the power consumption for refresh operation can be reduced as compared to the prior art.

This point will further be described. The present embodiment utilizes the cell array structure. There are the decoders which use the boosted voltage. For refresh operations, any one of the cell arrays S0 and s1 is selected, while the remaining is not selected, so that the number of the block to be boosted is reduced, and thus the power for generating the boosted voltage is also reduced. In accordance with the present embodiment, each cell array has the decoders to be supplied with the boosted voltage. In the refresh operation, only any one of the cell arrays is activated, wherein a plurality of word lines are subjected to the concurrent refresh in the selected cell array.

The present invention is not reduce an AC current with operation of the decoders but is to reduce the current of the boosting circuit 90, which is consumed with operation of the decoders. The boosted voltage has a larger amplitude, for which reason the reduction in the current causes a large effect of reducing the power consumption. For boosting the voltage, it is necessary that the voltage level is risen by a charge pump. A current consumed for this purpose is not 100% of the current consumed at the boosted voltage level. The boosted voltage is supplied at an efficiency of about 40% of the current to be consumed for rising the voltage level. For example, for supplying a current of 40 mA, a current of 100 mA is necessary to boost the voltage. Thus, the reduction in the output current from the boosting circuit 90 is extremely effective to reduce the power consumption.

In the above-described embodiment, for the purpose of simplification of the descriptions, the number of the cell arrays is 2, and the number of the blocks in each of the cell arrays is 4. In the products, the number of the cell arrays may be 3 or more, and the number of the blocks may be 5 or more. Needless to say, the number of the main word lines MWL to be concurrently refreshed is not limited to 4.

For example, if at least three cell arrays are present, for refresh operation, one of the cell arrays is selected, while the other cell arrays are not selected, thereby to reduce the number of blocks to be boosted, and whereby the power for generating the boosted voltage is also reduced. In the present embodiment, each cell array has the decoders to be supplied with the boosted voltage. In the refresh operation, only any one of the cell arrays is activated, wherein a plurality of word lines are subjected to the concurrent refresh in the selected cell array.

In case of at least three cell arrays, even if the plural cell arrays are selected for the refresh operations, while at least one cell array is not selected, so that an effect of reducing the power consumption can be obtained as compared to the prior art which selects all of the cell arrays.

Some of the above-described pseudo SRAM perform both the read/write operation and the refresh operation in one memory cycle. The present invention is also applicable to this device.

In the above-described first embodiment, the descriptions have been made by taking the pseudo SRAM as one example. The present invention is also generally applicable to semiconductor memory devices which need refresh operations, typically DRAM and pseudo SRAM, and particularly suitable for the device which is needed to reduce the power consumption for the refresh operation.

(Second Embodiment)

Figure 12:
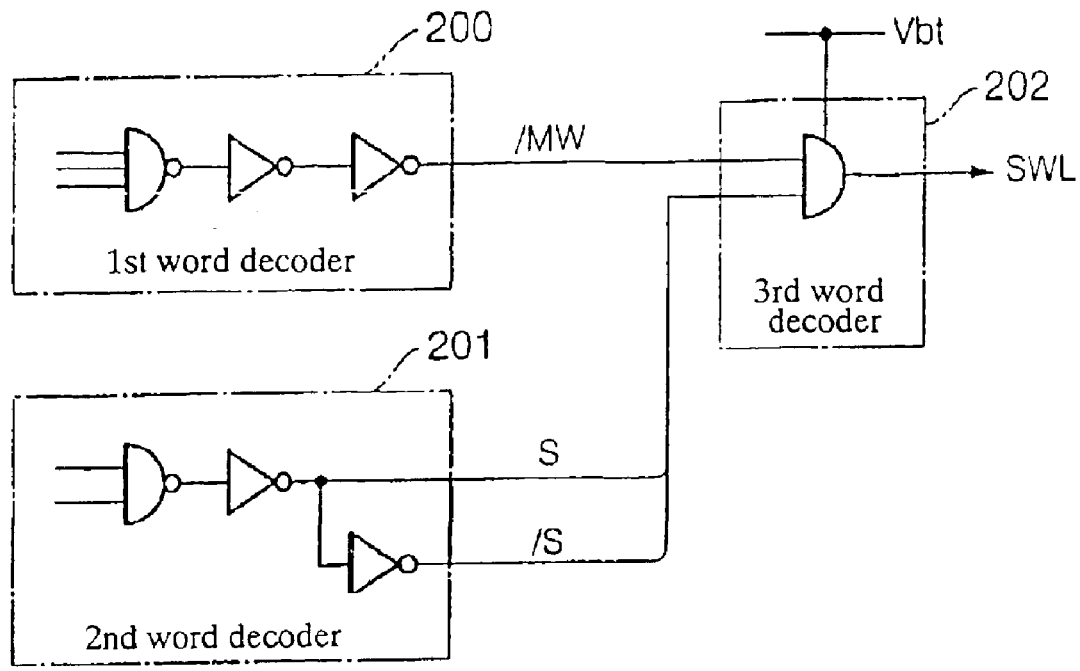
FIG. 12 is a block diagram illustrative of an essential part of a semiconductor memory device in accordance with a second embodiment of the present invention.

A second embodiment of the present invention will be described. This embodiment is a modification to the above embodiment. The following descriptions will focus onto modified matters. FIG. 12 is a circuit diagram illustrative of the structure of the second embodiment.

In this embodiment, the boosting driver with the boosted voltage shown in FIG. 10 is not used in the output circuits of the first word decoders 70 and 80. As shown in FIG. 12, a first logic circuit 200 with a power voltage VDD is used therein for supplying a non-boosted low level first word line selecting signal /MW to third word decoders 202 formed in the cell arrays. Similarly, the boosting drivers DR0~DR3 with the boosted voltage Vbt shown in FIG. 11 are not used in the output circuits of the second word decoders 40 and 50. As shown in FIG. 12, a second logic circuit 201 with the power voltage VDD is used therein for supplying a non-boosted low level second word line selecting signal S and /S to the third word decoders 202 formed in the cell arrays.

In the third word decoder, the signal is boosted by the boosted voltage Vbt based on the above signal /MW, the signal S and the signal /S, and the boosted signal is then applied to the third word decoder. The boosted voltage Vbt is not supplied to the first word decoders and the second word decoders but is supplied to only the third word decoders, so as to obtain a further reduction of the power consumption.

Figure 13:
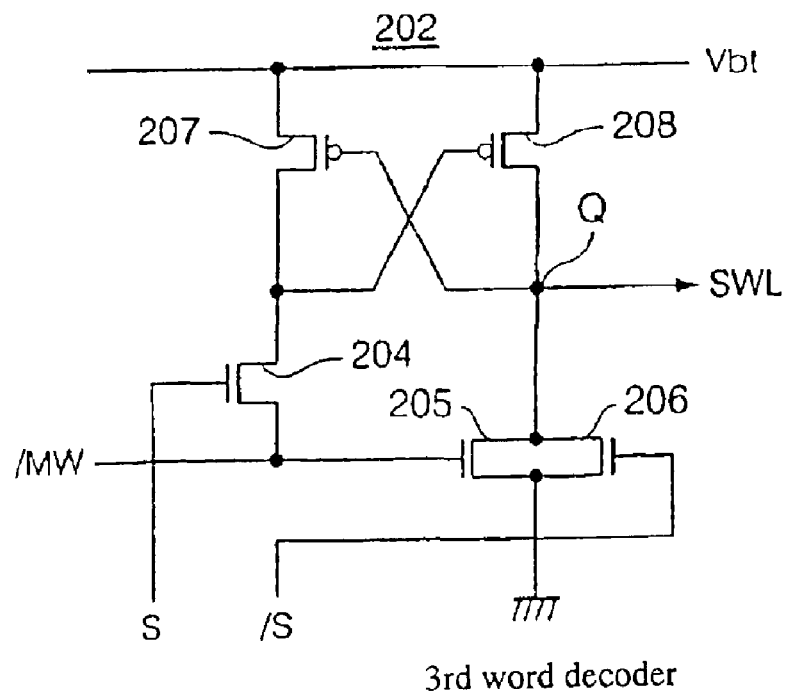
FIG. 13 is a circuit diagram illustrative of a structural example of a third word decoder in FIG. 12.

FIG. 13 is a circuit diagram illustrative of the structural example of the above-described third word decoder 202. The third word decoder 202 may comprise n-channel FETs 204~206 and p-channel FETs 207 and 208. The boosted voltage Vbt is supplied to sources of the p-channel FETs 207 and 208. Drains of the p-channel FET 207 and the n-channel FET 204 are connected to each other and also connected commonly to a gate of the p-channel FET 208. The siganl S is supplied to the gate of the n-channel FET 204. A gate of the p-channel FET 207 and a drain of the p-channel FET 208 are commonly connected to an output node Q. Sources of the n-channel FETs 205 and 206 are connected to each other and commonly grounded. Drains of the n-channel FETs 205 and 206 are connected to each other and commonly connected to the output node Q. The signal /MW is supplied to a gate of the n-channel FET 205, while the signal /S is supplied to a gate of the n-channel FET206.

Operations of the above third word decoder 202 will be described. When the signal /MW is "1", then the FET 205 turns ON, whereby a potential of the output node Q of the FETs 205, 206 and 208 shown in the drawing become the ground potential. Independent from the values of the signals S and /S, this ground potential is supplied to the third word line SWL, whereby the third word line SWL is inactivated.

When the signal /MW is "0", then the FET 205 turns OFF, whereby the potential level of the output node Q depends on the values of the signals S and /S. If the signal S is "1" and the signal /S is "0", then the FETs 204 and 208 turns ON, while the FETs 206 and 207 turn OFF, and the potential of the output node Q becomes the boosted voltage Vbt. This boosted voltage Vbt is supplied to the third word line SWL, whereby the third word line SWL is activated.

If the signal S is "0" and the signal /S is "1", then the FET 204 turns OFF and the FET 206 turns ON, whereby the FET 207 turns ON, while the FET 208 turns OFF. The potential of the output node Q becomes the ground voltage. This ground voltage is supplied to the third word line SWL.

In accordance with the second embodiment, only the third word decoder has the voltage level conversion function, while the first and second word decoders comprise the circuits with the power voltage VDD without using the boosted voltage Vbt, whereby the power consumption by the first and second word decoders are reduced.

(Third Embodiment)

Figure 14:
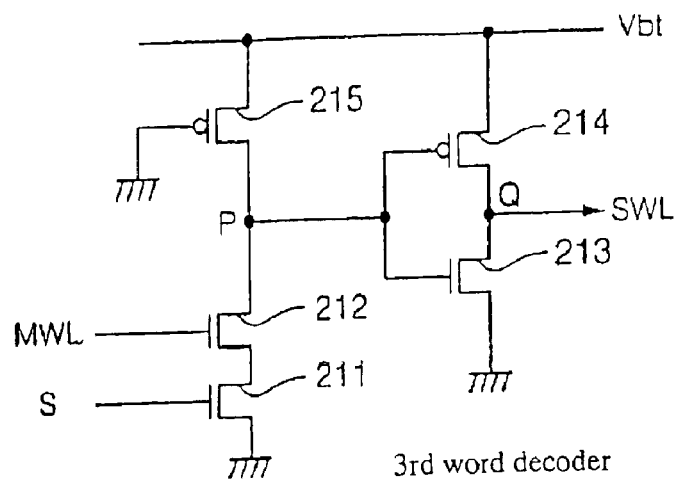
FIG. 14 is a block diagram illustrative of an essential part of a semiconductor memory device in accordance with a third embodiment of the present invention.

A third embodiment of the present invention will be described. This embodiment is a modification to the above first embodiment. The following descriptions will focus onto modified matters. FIG. 14 is a circuit diagram illustrative of the structure of the third embodiment. In this embodiment shown in this figure, instead of the two output signals S and /S from the second word decoder, only the signal S drives the third word decoder.

The third word decoder may comprise n-channel FETs 211~213 and p-channel FETs 214 and 215. A gate of the p-channel FET 215 is grounded. The boosted voltage Vbt is supplied through the p-channel FET 215 to a node P, wherein the p-channel FET serves as a load resistance. The n-channel FETs 211 and 212 are connected in series between the node P and the ground. The signal on the first word line MWL is applied to a gate of the FET 212. The output signal S from the second word decoder is supplied to a gate of the FET 211. The boosted voltage Vbt is also supplied to a source of the p-channel FET 214. Drains of the p-channel FET 214 and the n-channel FET 213 are connected to each other and also connected commonly to an output node Q. Gates of the p-channel FET 214 and the n-channel FET 213 are connected to each other and also commonly connected to the node P, so that the potential of the node P is the gate potential of the p-channel FET 214 and the n-channel FET 213. A source of the n-channel FET 213 is grounded.

Operations of the above third word decoder will be described. When the signal on the first word line signal MWL is "0", then the FET 212 turns OFF, whereby the potential of the output node P of the FET 212 and the FET 215 becomes the boosted voltage. As a result, the FET 213 turns ON, while the FET 214 turns OFF, so that the potential of the output node Q of the FET 213 and the FET 214 becomes the ground potential which is supplied to the third word line SWL.

If the signal /MW is "1", then the FET 212 turns ON. In this case, the signal to the third word line SWL is decided by the signal S. If the signal S is "1", then the FET 211 turns ON, whereby the potential of the node P becomes the ground potential, whereby the FET 214 turns ON, while the FET 213 turns OFF, and the potential of the output node Q becomes the boosted voltage Vbt which is supplied to the third word line SWL. As a result, the third word line SWL is activated. In contrast, if the signal S is "0", then the FET 211 turns OFF, whereby the potential of the node P becomes the boosted voltage Vbt, whereby the FET 214 turns OFF, while the FET 213 turns ON, and the potential of the output node Q becomes the ground potential which is supplied to the third word line SWL.

In accordance with the above-described embodiment, instead of using two non-inverted and inverted signals for the outputs from the first word decoder and the second word decoder, only one signal is used for reducing the AC power. In case of the circuit of FIG. 14, a through current flowing through the FETs 211, 212 and 215 appears for selecting the third word line, but only for this selecting time, for which reason this through current can be almost ignored.

As a modified example, it is possible that the signal MW of the first word line MWL is applied to the gate of the FET 211, while the signal S is inputted into the gate of the FET 212. If the same signal as of an adjacent circuit is inputted into the FETs 211 in the ground side, then it is possible that the FET 211 in the ground side is commonly used for both the adjacent circuits.

(Fourth Embodiment)

Figure 15:
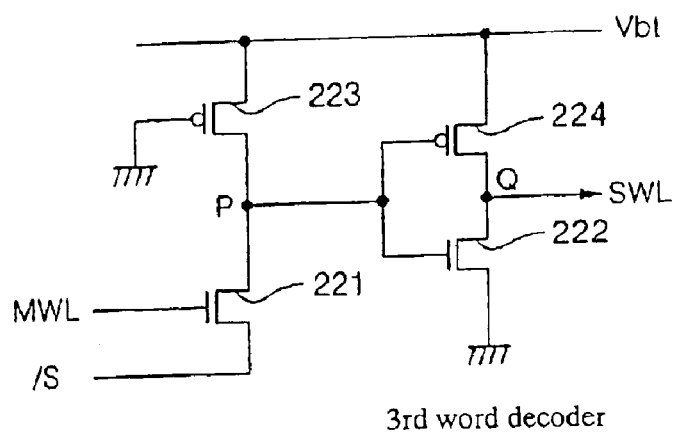
FIG. 15 is a block diagram illustrative of an essential part of a semiconductor memory device in accordance with a fourth embodiment of the present invention.
Figure 16:
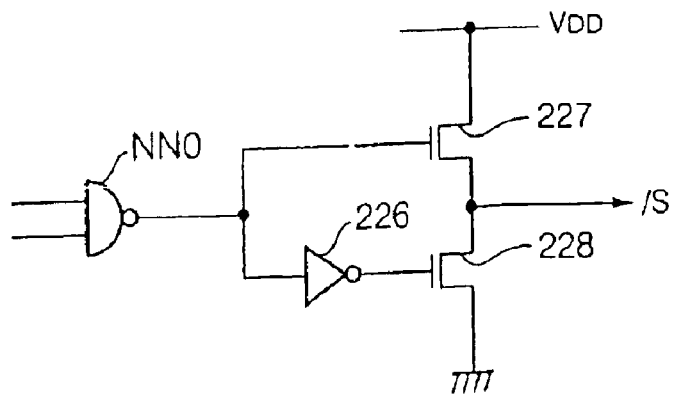
FIG. 16 is a circuit diagram illustrative of a partial structure of a second word decoder which outputs a signal /S in FIG. 15.

A fourth embodiment of the present invention will be described. This embodiment is a modification to the above first embodiment. The following descriptions will focus onto modified matters. FIGS. 15 and 16 are circuit diagrams illustrative of the structure of the fourth embodiment. In this embodiment shown in these figure, the third word decoder is operated by driving a source of a transistor included therein, thereby reducing amplifications of the output signal from the second word decoder or the first word decoder, and whereby the power consumption by those decoders is reduced. In FIG. 15, the output signal /S from the second word decoder is supplied to the source of the transistor included in the third word decoder, for driving the third word decoder. FIG. 16 shows an essential part of the structure of the second ward decoder in that case.

With reference to FIG. 15, the circuit structure and the operation of the third word decoder will be described. The third word decoder may comprise n-channel FETs 221 and 222 and p-channel FETs 223 and 224. A gate of the p-channel FET 223 is grounded. The boosted voltage Vbt is supplied through the p-channel FET 223 to a node P, wherein the p-channel FET 223 serves as a load resistance. Drains of the n-channel FETs 221 and 223 are connected to each other and commonly connected to the node P. The output signal /S from the second word decoder is supplied to a source of the n-channel FET 221. A signal of the first word line MWL is applied to a gate of the n-channel FET 221.

The boosted voltage Vbt is also supplied to a source of the p-channel FET 224. Drains of the p-channel FET 224 and the n-channel FET 222 are connected to each other and also connected commonly to an output node Q. Gates of the p-channel FET 224 and the n-channel FET 222 are connected to each other and also commonly connected to the node P, so that the potential of the node P is the gate potential of the p-channel FET 224 and the n-channel FET 222. A source of the n-channel FET 222 is grounded.

Operations of the above third word decoder will be described. When the signal on the first word line signal MWL is "0", then the FET 221 turns OFF, whereby the potential of the connecting point P of the FET 221 and the FET 223 becomes the boosted voltage. As a result, the FET 222 turns ON, while the FET 224 turns OFF, so that the potential of the connecting point Q of the FET 222 and the FET 224 becomes the ground potential which is supplied to the third word line SWL.

If the signal /MW is "1", then the FET 221 turns ON. In this case, the signal supply to the third word line SWL is decided by the signal /S. If the signal /S is "1", then the potential of the node P becomes the boosted voltage Vbt, whereby the FET 222 turns ON, while the FET 224 turns OFF, and the potential of the point Q becomes the ground potential, whereby the third word line SWL is inactivated. In contrast, if the signal /S is "0", then the potential of the point P becomes the ground potential, whereby the FET 224 turns ON, while the FET 222 turns OFF, and the potential of the point Q becomes the boosted voltage which is supplied to the third word line SWL. As a result, the third word line SWL is activated.

With reference to FIG. 16, the circuit structure and the operation of the second word decoder will be described. The second word decoder may comprise an NAND gate NN0, an inverter 226 and n-channel FETs 227 and 228. The n-channel FETs 227 and 228 are connected in series between a power voltage VDD and a ground. Drains of the n-channel FETs 227 and 228 are connected commonly to an output terminal. An output of the NAND gate NN0 is connected through the inverter 226 to a gate of the n-channel FET 228, and also is connected directly to a gate of the n-channel FET 227, so that the gate of the n-channel FET 227 is applied with the output signal from the NAND gate NN0, while the gate of the n-channel FET 228 is applied with an inverted signal from the output signal from the NAND gate NN0.

Those structural elements 226~228 constitute a driver instead of the driver DR0 shown in FIG. 11. In the circuit shown in FIG. 16, instead of the boosted voltage Vbt, the power voltage VDD is used for the driver. In this structure, if the output from the NAND gate NN0 is "0", then the output from the inverter 226 is "1", whereby the FET 227 turns OFF, while the FET 228 turns ON. As a result, the signal /S of the ground potential is outputted. If the output from the NAND gate NN0 is "1", then the output from the inverter 226 is "0", whereby the FET 227 turns ON, while the FET 228 turns OFF. As a result, the signal /S of (VDD-Vth) is outputted, wherein Vth is a threshold voltage of the gate of the FET 227.

The third word decoder circuit in the above-described second to fourth embodiments has the effect of reducing the current consumption in case that word lines are sequentially refreshed one by one, without application to the first embodiment, wherein the plural word lines are batch-refreshed.

(Fifth Embodiment)

Figure 17:
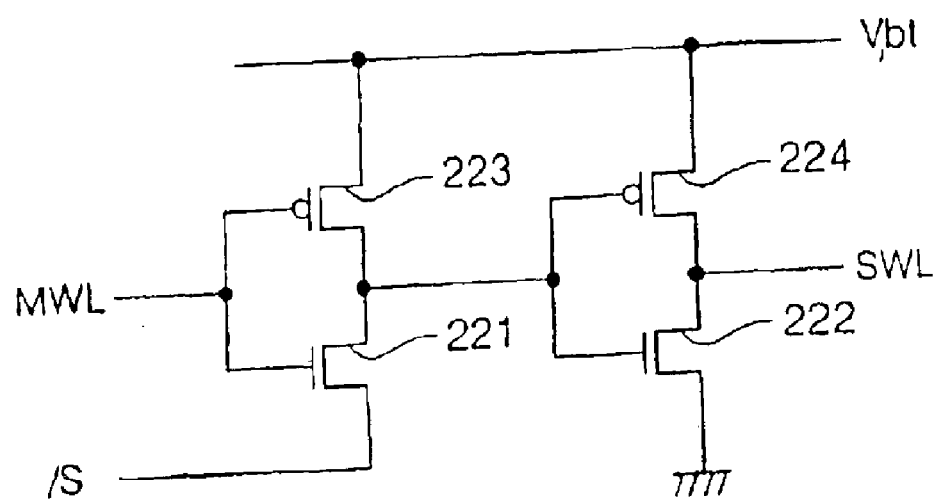
FIG. 17 is a circuit diagram showing a modified example of the circuit shown in FIG. 15.

A fifth embodiment of the present invention will be described. This embodiment is a modification to the above first embodiment. The following descriptions will focus onto modified matters. FIG. 17 is a circuit diagram illustrative of the structure of the fifth embodiment. This embodiment shown in this figure is a modification from the above-described fourth embodiment. Namely, in the circuit shown in FIG. 15, when the signal of the first word line MWL becomes "1", then a through current flowing through the FET 223 and the FET 221 appears. As the number of the first word lines is increased, then this current becomes remarkable.

In the embodiment of FIG. 17, the signal of the first word line MWL entered into the FET 221 is applied to the gate of the FET 223. In this case, the FET 223 should have to be the normal ON in the logical viewpoint, the FET 223 is boosted, and the signal of the word line MWL is "1", and the FET does not turn OFF. If the signal of the first word line MWL is "1", then gate voltage of the FET 223 is boosted to the voltage Vcc, a difference between the boosted level and the Vcc or 2Vth is applied, whereby the FET is in a slightly ON state to reduce the current. In view of the first word line MWL, the FET 223 serves as a load. In consideration of the through current an the load of the first word line MWL, it is possible to select any one of the circuits shown in FIGS. 15 and 17.

The above descriptions are the detailed descriptions of the embodiment. The embodiments take the cell array structure instead of the bank structure. In accordance with the embodiment, in FIG. 2, one of the pre-decoder 30 and one of the main decoder 60 are provided. It is impossible to carry out the read/write operations of two cell arrays S0 and S1 independently. In other words, the embodiments are to reduce the power consumption to be reduced for the refresh operation.

In the present embodiments, as described above, the refresh is made simultaneously for the plural word lines for the single cell array, whereby for refreshing the cell array S0, while the first word decoder 80 and the second word decoder 50 being inactivated to cause that almost no power consumption of the boosted voltage Vbt appears. Simultaneously, refreshing the cell array S0 is not to activate the first word decoder 80 and the second word decoder 50. Similarly, if the cell array S1 is refreshed, then the first word decoder 70 and the second word decoder 40 are not activated. Almost no power consumption of the boosted voltage Vbt appears. Thus, it is possible to reduce the power consumption for the refresh operation as compared to the prior art, wherein the two cell arrays S0 and S1 are refreshed simultaneously.

In the above-described embodiment, for the purpose of simplification of the descriptions, the number of the cell arrays is 2, and the number of the blocks in each of the cell arrays is 4. In the products, the number of the cell arrays may be 3 or more, and the number of the blocks may be 5 or more. Needless to say, the number of the main word lines MWL to be concurrently refreshed is not limited to 4.

For example, if at least three cell arrays are present, for refresh operation, one of the cell arrays is selected, while the other cell arrays are not selected, thereby to reduce the number of blocks to be boosted, and whereby the power for generating the boosted voltage is also reduced. In the present embodiment, each cell array has the decoders to be supplied with the boosted voltage. In the refresh operation, only any one of the cell arrays is activated, wherein a plurality of word lines are subjected to the concurrent refresh in the selected cell array.

In case of at least three cell arrays, even if the plural cell arrays are selected for the refresh operations, while at least one cell array is not selected, so that an effect of reducing the power consumption can be obtained as compared to the prior art which selects all of the cell arrays.

In the present invention, if the third word line SWL is selected, then the third word line SWL is selected at the crossing point between the first word line MWL extending in the row direction and the second word line SSL extending in the column direction. This is the cell arrays of the present invention. Respective ones of the second word decoders 40 and 50 are presented in the cell array S0 or the cell array S1. In the present embodiment, if the four first word lines MWL are selected in the specific cell array, it is not necessary to provide the second word decoders respectively for every the first word lines MWL.

In the conventional semiconductor memory device, the second word decoder is provided for every blocks the second word line is formed for every blocks B00–B03, B10–B13. In this structure, it is necessary to drive all of the four second word decoders for batch-refreshing the four first word lines, each of which is for each block. This is extremely inefficiency.

In accordance with the present invention, the second word line SSL extends through the cell arrays, for which reason the area is reduced as compared to the prior art.

As described above, in the present embodiment, the cell arrays are defined to have the through-extension of the word lines, wherein the plural first word lines MWL are refreshed. In the present embodiment, the second word lines SSL extend through the cell arrays, so that the plural first word lines are selected. The second word lines extend through the cell arrays, so that one set of signals is driven. It is unnecessary that the second word lines extend in longitudinal and lateral directions. The area can be reduced and the power consumption can be reduced.

In the prior art, the first word lines extend in the row direction. The second word lines do not extend in the column directions. The unit of the every second word lines of the prior art correspond to the cell array of the present embodiment. In the present embodiment, the plural first word lines MWL are activated in one cell array. In the prior art, a set of the sense amplifiers is present in the one cell array, for which reason the plural first word lines could not be selected. In the prior art, a plurality of correspondences to the cell arrays S0 and S1 are selected. Namely, in the present embodiment, the plural word lines MWL selected in the refresh are supplied with the signal of the second word signals. In accordance with the prior art, each of the plural first word lines selected in the refresh is supplied with the signal of the second word line.

In the present embodiment, the description will be made by taking the pseudo SRAM as one example. Notwithstanding, the present invention is applicable to the semiconductor memory devices which need the refresh operations, typically, the DRAM and the pseudo SRAM, and more particularly to the device which needs reduction of the power consumption for the refresh operation.

The present invention should not be limited to the configurations of the above embodiments. Any modifications to the present invention may be available within the extent of the subject matter of the present invention.

Effect of the Invention

As described above, in accordance with the present invention, the refresh operation of the semiconductor memory device with the cell array structure batch-selects the plural selecting signals for reducing the power consumption for the refresh operation.

The device has the boosting circuit for increasing the effect of reducing the power consumption.

The cell array is divided into the plural blocks. The refresh is made for the block unit, for example, the one word line for the one block, to order to simplify the refresh circuit.

What is claimed is:

1. A semiconductor memory device, comprising:
   a plurality of cell arrays including a plurality of blocks which comprises a plurality of memory cells and a means for reading data from said plurality of memory cells;
   a plurality of first word selecting signal lines for said plurality of cell arrays respectively, and said plurality of first word selecting signal lines extending in a first direction;
   a first word decoder selectively activating a first word selecting signal to be supplied to said plurality of first word selecting signal lines in accordance with an address signal;
   a plurality of second word selecting signal lines for said plurality of cell arrays respectively, and said plurality of second word selecting signal lines extending in a second direction different from said first direction, so that said plurality of second word selecting signal lines penetrate said plurality of blocks;
   a second word decoder selectively activating a second word selecting signal to be supplied to said plurality of second word selecting signal lines commonly to said plurality of blocks in accordance with said address signal; and
   a word driver for activating at least one word line in accordance with said first and second word selecting signals, wherein in a refresh operation, at least one cell array of said plurality of cell arrays is non-selected, and the remaining of said plurality of cell arrays is selected as at least one selected cell array, and said first and second word decoders of said at least one selected cell array are activated, and said first and second word selecting signals included in said at least one selected cell array are batch-selected by said first word decoder.

2. The semiconductor memory device as claimed in claim 1, wherein said first and second directions are perpendicular to each other.

3. The semiconductor memory device as claimed in claim 1, wherein in a refresh operation, said plurality of first word selecting signal lines included in said at least one selected cell array are activated to select the same number of word lines for every block included in said at least one selected cell array selected by said first word decoder.

4. The semiconductor memory device as claimed in claim 1, wherein if a refresh signal is activated, said first and second word decoders activate a plurality of said first word selecting signals and a plurality of said second word selecting signals respectively in accordance with said address signal, and if said refresh signal is inactivated, said first and second word decoders activate one of said first word selecting signals and one of said second word selecting signals respectively in accordance with said address signal.

5. The semiconductor memory device as claimed in claim 1, wherein said first word decoder comprises: a gate circuit for outputting said first word selecting signal in accordance with said address signal; and a boosting driver for boosting an output from said gate circuit.

6. The semiconductor memory device as claimed in claim 5, wherein said boosting driver further comprises: a level shifter circuit for shifting an output level of said gate circuit; and a switching circuit for outputting a boosted voltage signal or a low voltage signal in accordance with an output level of said level shifter circuit.

7. The semiconductor memory device as claimed in claim 1, wherein said second word decoder comprises: a gate circuit for outputting said second word selecting signal in accordance with said address signal; and a boosting driver for boosting an output from said gate circuit.

8. The semiconductor memory device as claimed in claim 1, wherein said word driver comprises an AND circuit for taking an AND-logic of said first word selecting signal and said second word selecting signal.

9. The semiconductor memory device as claimed in claim 8, wherein said AND circuit comprises a switching circuit for performing an ON/OFF control of said second word selecting signal in accordance with said first word selecting signal.

10. The semiconductor memory device as claimed in claim 8, wherein said AND circuit comprises a switching circuit for boosting said second word selecting signal and outputting said boosted signal or for outputting said second word selecting signal as a low level signal.

11. The semiconductor memory device as claimed in claim 8, wherein said AND circuit comprises:
    a flip-flop circuit driven by a boosted voltage;
    a first switching circuit driven by said first word selecting signal for placing said flip-flop circuit into an enable state; and
    a second switching circuit for driving said flip-flop circuit in accordance with said second word selecting signal when said flip-flop circuit is in said enable state.

12. The semiconductor memory device as claimed in claim 1, wherein said second decoder outputs said second word selecting signal of a first potential based on said address signal; and said word driver activates or inactivates said at least one word line in accordance with said first and second word selecting signals, and said word driver causing said at least one word line to have a second potential different from said first potential when said at least one word line is activated.

13. The semiconductor memory device as claimed in claim 12, wherein said word driver comprises:
    a first transistor having a gate supplied with said first word selecting signal, a source applied with said second word selecting signal, and a drain supplied with said second potential through a load; and
    a driver circuit being provided between a ground potential and said second potential for driving said word line in accordance with a drain voltage of said first transistor.

14. The semiconductor memory device as claimed in claim 13, wherein said load comprises a second transistor having a gate supplied with said first word selecting signal, a source applied with said second potential, and a drain connected to said drain of said first transistor.

15. The semiconductor memory device as claimed in claim 12, wherein said second potential is a boosted voltage higher than said first potential.

16. The semiconductor memory device as claimed in claim 1, wherein a read/write operation and a refresh operation are conducted in one memory cycle.

17. A word selecting circuit for selecting a word line in accordance with an address signal, and said word selecting circuit, comprising:
    a first decoder for outputting an output signal of a first potential based on said address signal; and
    a word driver for activating or inactivating said word line in accordance with said output signal and a first selecting signal, and said word driver causing said word line to have a second potential different from said first potential when said word line is activated, wherein said word driver includes:
        a first transistor having a gate supplied with said first selecting signal, a source applied with said output signal, and a drain supplied with said second potential through a load; and
        an output circuit supplying said second potential to said word line in accordance with a drain voltage of said first transistor.

18. The word selecting circuit as claimed in claim 17, wherein said second potential is higher than said first potential.

19. The word selecting circuit as claimed in claim 17, wherein said load comprises a second transistor having a gate supplied with said first selecting signal, a source applied with said second potential, and a drain connected to said drain of said first transistor.

20. A semiconductor memory device, comprising:
    a plurality of cell arrays having a plurality of memory cells;
    a selecting circuit for generating a pre-decode signal in accordance with an address signal;
    a plurality of word line selecting circuits for said plurality of cell arrays, respectively, being supplied with said pre-decode signal, and
    each of said plurality of word line selecting circuits comprising:
        a first decoder for outputting a first word line selecting signal of a first potential based on said pre-decode signal; and
        a word driver for activating or inactivating a word line in accordance with both said first word line selecting signal and a second word line selecting signal based on said pre-decode signal, and said word driver causing said word line to have a second potential different from said first potential in activating said word line, wherein in a refresh operation, at least one word line selecting circuit of said plurality of word line selecting circuits is inactivated, and the remaining of said plurality of word line selecting circuits are selectively activated, and wherein said first and second word line selecting signals included in said remaining plurality of word line selecting circuits that are selectively activated are batch-selected by the first word decoder.

21. The semiconductor memory device as claimed in claim 20, wherein said second potential is higher than said first potential.

22. The semiconductor memory device as claimed in claim 20, wherein said word driver comprises:
    a first transistor having a gate supplied with said first word line selecting signal, a source applied with said output signal, and a drain connected through a load to a boosted voltage; and
    an output circuit supplying said boosted voltage signal or a ground voltage in accordance with a drain voltage of said first transistor.

23. The semiconductor memory device as claimed in claim 22, wherein said load comprises a second transistor having a gate supplied with said first word line selecting signal, a source applied with said boosted voltage, and a drain connected to said drain of said first transistor.

24. The semiconductor memory device as claimed in claim 20, wherein each of said plurality of cell arrays comprises a plurality of blocks, and each of said plurality of blocks has means for reading data from said memory cells.

25. The semiconductor memory device as claimed in claim 24, wherein said word line selecting circuit activated in said refresh operation activates the same number of word lines for every plurality of blocks included in a cell array corresponding to said activated word line selecting circuit.

26. The semiconductor memory device as claimed in claim 20, wherein said semiconductor memory device conducts a read/write operation and a refresh operation in one memory cycle.

* * * * *